(12) United States Patent
Choo et al.

(10) Patent No.: US 9,859,848 B2
(45) Date of Patent: Jan. 2, 2018

(54) VARIABLE VOLTAGE GENERATION CIRCUIT AND MEMORY DEVICE INCLUDING THE SAME

(71) Applicant: SAMSUNG ELECTRONICS CO., LTD., Suwon-si, Gyeonggi-do (KR)

(72) Inventors: Gyo-Soo Choo, Yongin-si (KR); Pil-Seon Yoo, Seoul (KR); Duk-Min Kwon, Seoul (KR); Chung-Ho Yu, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 16 days.

(21) Appl. No.: 14/996,248

(22) Filed: Jan. 15, 2016

(65) Prior Publication Data
US 2016/0352223 A1 Dec. 1, 2016

(30) Foreign Application Priority Data

May 28, 2015 (KR) ........................ 10-2015-0074685

(51) Int. Cl.
*G05F 1/46* (2006.01)
*H03F 1/30* (2006.01)
(Continued)

(52) U.S. Cl.
CPC .............. *H03F 1/301* (2013.01); *G05F 1/463* (2013.01); *G05F 1/563* (2013.01); *G11C 5/147* (2013.01);
(Continued)

(58) Field of Classification Search
CPC ..... G05F 3/10; G05F 3/16; G05F 3/20; G05F 3/26; G05F 3/18; G05F 3/185; G05F 3/30;
(Continued)

(56) References Cited

U.S. PATENT DOCUMENTS 5,291,446 A 3/1994 Van Buskirk et al.
5,900,781 A 5/1999 Igarashi et al.
(Continued)

FOREIGN PATENT DOCUMENTS

JP 3479404 10/2003
KR 10-2012-0140550 12/2012

*Primary Examiner* — Timothy J Dole
*Assistant Examiner* — Bryan R Perez
(74) *Attorney, Agent, or Firm* — Volentine & Whitt, PLLC

(57) ABSTRACT

A variable voltage generation circuit includes a first amplification circuit and a second amplification circuit. The first amplification circuit generates a first output voltage based on a reference voltage, a first feedback voltage, a temperature-varied voltage and a temperature-fixed voltage such that the first output voltage is varied in a first voltage range according to a variation of the operational temperature. The first amplification circuit generates the first feedback voltage based on the first output voltage. The second amplification circuit generates a second output voltage based on the first feedback voltage, a second feedback voltage, the temperature-varied voltage and the temperature-fixed voltage such that the second output voltage is varied in a second voltage range wider than the first voltage range according to the variation of the operational temperature. The second amplification circuit generates the second feedback voltage based on the second output voltage.

19 Claims, 23 Drawing Sheets

(51) Int. Cl.
*G05F 1/563* (2006.01)
*G11C 5/14* (2006.01)
*G11C 7/04* (2006.01)
*G11C 16/30* (2006.01)
*G05F 1/567* (2006.01)
*G05F 3/24* (2006.01)
*G05F 1/56* (2006.01)

(52) U.S. Cl.
CPC .............. *G11C 7/04* (2013.01); *G11C 16/30* (2013.01); *G05F 1/56* (2013.01); *G05F 1/567* (2013.01); *G05F 3/245* (2013.01); *H03F 2200/447* (2013.01); *H03F 2200/468* (2013.01)

(58) Field of Classification Search
CPC ... G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 1/461; G05F 1/462; G05F 1/463; G05F 1/465; G05F 1/468; G05F 1/565; G05F 1/567; G05F 1/575; G05F 1/577
See application file for complete search history.

(56) References Cited

U.S. PATENT DOCUMENTS

| | | |
|---|---|---|
| 6,300,832 B1 | 10/2001 | Okazaki |
| 6,683,490 B2 | 1/2004 | Kaminishi |
| 6,801,454 B2 | 10/2004 | Wang et al. |
| 7,116,088 B2 | 10/2006 | Tran et al. |
| 7,463,528 B2 | 12/2008 | Mokhlesi et al. |
| 7,543,253 B2 | 6/2009 | Marinca et al. |
| 7,843,038 B2 | 11/2010 | Seremeta |
| 7,855,542 B2 | 12/2010 | Heilmann |
| 8,130,026 B2 | 3/2012 | Maejima |
| 8,228,739 B2 | 7/2012 | Pan et al. |
| 8,576,651 B2 | 11/2013 | Scheuerlein et al. |
| 8,681,567 B2 | 3/2014 | Missiroli |
| 8,755,234 B2 | 6/2014 | Oowada et al. |
| 2010/0066433 A1* | 3/2010 | Mochizuki ............ H03F 1/301 327/512 |
| 2010/0301819 A1 | 12/2010 | Wang |
| 2011/0227636 A1 | 9/2011 | Endo et al. |
| 2012/0326787 A1 | 12/2012 | Kang et al. |

* cited by examiner

VARIABLE VOLTAGE GENERATION CIRCUIT AND MEMORY DEVICE INCLUDING THE SAME

CROSS-REFERENCE TO RELATED APPLICATION

This U.S. Non-provisional application claims priority under 35 USC §119 to Korean Patent Application No. 10-2015-0074685, filed on May 28, 2015, in the Korean Intellectual Property Office (KIPO), the disclosure of which is incorporated by reference in its entirety herein.

BACKGROUND

1. Technical Field

Example embodiments relate generally to semiconductor integrated circuits, and more particularly to a variable voltage generation circuit for generating a voltage that varies depending on a temperature, and a memory device including the variable voltage generation circuit.

2. Discussion of the Related Art

Recently, semiconductor integrated circuits such as memory devices tend to be very sensitive to an operational temperature as the integration degree and the operation speed of the semiconductor integrated circuits are increased. It is required to control the semiconductor integrated circuit deliberately, depending on the operational temperature, so as to prevent malfunction and enhance performance of the semiconductor integrated circuit.

SUMMARY

At least one example embodiment of the present disclosure may provide a variable voltage generation circuit having a wide output voltage range with respect to an operational temperature range.

At least one example embodiment of the present disclosure may provide a memory device including a variable voltage generation circuit having a wide output voltage range with respect to an operational temperature range.

According to example embodiments, a variable voltage generation circuit includes a first amplification circuit and a second amplification circuit. The first amplification circuit generates a first output voltage based on a reference voltage, a first feedback voltage, a temperature-varied voltage that is varied depending on an operational temperature and a temperature-fixed voltage that is fixed regardless of the operational temperature such that the first output voltage is varied in a first voltage range according to a variation of the operational temperature. The first amplification circuit generates the first feedback voltage based on the first output voltage. The second amplification circuit generates a second output voltage based on the first feedback voltage, a second feedback voltage, the temperature-varied voltage and the temperature-fixed voltage such that the second output voltage is varied in a second voltage range wider than the first voltage range according to the variation of the operational temperature. The second amplification circuit generates the second feedback voltage based on the second output voltage.

In some example embodiments, the first amplification circuit may include a first differential input node pair receiving the reference voltage and the first feedback voltage and the second amplification circuit may include a second differential input node pair receiving the first feedback voltage and the second feedback voltage.

In some example embodiments, each of the first amplification circuit and the second amplification circuit may further include a differential input node pair receiving the temperature-varied voltage and the temperature-fixed voltage.

In some example embodiments, the first amplification circuit may generate a first voltage offset corresponding to a difference between the reference voltage and the first feedback voltage based on the temperature-varied voltage and the second amplification circuit may generate a second voltage offset corresponding to a difference between the first feedback voltage and the second feedback voltage based on the temperature-varied voltage.

In some example embodiments, the first voltage range may be proportional to the first voltage offset and the second voltage range may be proportional to a sum of the first voltage offset and the second voltage offset.

In some example embodiments, the first amplification circuit and the second amplification circuit may have the same configuration and the second voltage range may be twice the first voltage range.

In some example embodiments, the first amplification circuit may include a first differential difference amplifier configured to generate a first amplification voltage based on the reference voltage, the first feedback voltage, the temperature-varied voltage and the temperature-fixed voltage and a first output circuit configured to generate the first output voltage and the first feedback voltage proportional to the first output voltage based on the first amplification voltage.

In some example embodiments, the second amplification circuit may include a second differential difference amplifier configured to generate a second amplification voltage based on the first feedback voltage, the second feedback voltage, the temperature-varied voltage and the temperature-fixed voltage and a second output circuit configured to generate the second output voltage and the second feedback voltage proportional to the second output voltage based on the second amplification voltage.

In some example embodiments, the variable voltage generation circuit may further include a third amplification circuit. The third amplification circuit may generate a third output voltage based on the second feedback voltage, a third feedback voltage, the temperature-varied voltage and the temperature-fixed voltage such that the third output voltage is varied in a third voltage range wider than the second voltage range according to the variation of the operational temperature. The third amplification circuit may generate the third feedback voltage based on the third output voltage.

In some example embodiments, the first amplification circuit may include a first differential input node pair receiving the reference voltage and the first feedback voltage, the second amplification circuit may include a second differential input node pair receiving the first feedback voltage and the second feedback voltage and the third amplification circuit may include a third differential input node pair receiving the second feedback voltage and the third feedback voltage.

In some example embodiments, the first amplification circuit, the second amplification circuit and the third amplification circuit may have the same configuration, the second voltage range is twice the first voltage range, and the third voltage range may be three times the first voltage range.

According to example embodiments, a variable voltage generation circuit includes first through n-th amplification circuits. The first amplification circuit generates a first output voltage based on a reference voltage, a first feedback voltage, a temperature-varied voltage that is varied depending on an operational temperature and a temperature-fixed voltage that is fixed regardless of the operational temperature such that the first output voltage is varied in a first voltage range according to a variation of the operational temperature. The first amplification circuit generates the first feedback voltage based on the first output voltage. The k-th amplification circuit (k is an integer greater than 1 and smaller than or equal to n) generates a k-th output voltage based on a (k−1)-th feedback voltage, a k-th feedback voltage, the temperature-varied voltage and the temperature-fixed voltage such that the k-th output voltage is varied in a k-th voltage range wider than a (k−1)-th voltage range according to the variation of the operational temperature. The k-th amplification circuit generates the k-th feedback voltage based on the k-th output voltage.

In some example embodiments, the first amplification circuit may include a first differential input node pair receiving the reference voltage and the first feedback voltage and the k-th amplification circuit may include a k-th differential input node pair receiving the (k−1)-th feedback voltage and the k-th feedback voltage.

In some example embodiments, the first through k-th amplification circuits may have the same configuration and the k-th voltage range may be k times the first voltage range.

In some example embodiments, the variable voltage generation circuit may further include a selector configured to select and output one of the first through n-th output voltages.

According to example embodiments, a variable amplifier includes a first linear amplifier that generates a first voltage within a first voltage range according to a linear relationship of a reference voltage, a difference between a voltage that varies in accordance with an environmental temperature and a voltage that is invariant with the environmental temperature, and a first amplification factor. A second linear amplifier generates a second voltage within a second voltage range according to a linear relationship of the first voltage, the difference between the voltage that varies in accordance with the environmental temperature and the voltage that is invariant with the environmental temperature, and a second amplification factor.

In some example embodiments, the second voltage range includes the entire first voltage range.

In some example embodiments, the first voltage may vary linearly within the first voltage range in accordance with a change in the difference between the voltage that varies in accordance with the environmental temperature and the voltage that is invariant with the environmental temperature, and the second voltage may vary linearly within the second voltage range in accordance with the change in the difference between the voltage that varies in accordance with the environmental temperature and the voltage that is invariant with the environmental temperature.

In some example embodiments, the first linear amplifier generates the first voltage, $V_1$, expressed as: $V_1=V_{Ref}+C_1*(V_{tv}-V_{ti})$, where $V_{Ref}$ is the reference voltage, $C_1$ is the first amplification factor, $V_{tv}$ is the voltage that varies in accordance with the environmental temperature, and $V_{ti}$ is the voltage that is invariant with the environmental temperature. The second linear amplifier generates the second voltage, $V_2$, expressed as: $V_2=V_1+C_2*(V_{tv}-V_{ti})$, where $C_2$ is the second amplification factor.

In some example embodiments, the variable amplifier may include a third amplifier that generates a third voltage, $V_3$, within a third voltage range according to the linear relationship $V_3=V_1+n*C_1*(V_{tv}-V_{ti})$, where n is an integer greater than 1.

The variable voltage generation circuit according to example embodiments may expand the output voltage range with respect to the operational temperature range and enhance linearity through the multiple feedback operations using a plurality of amplification circuits having voltage offsets depending on the operational temperature.

The memory device according to example embodiments may control the operational characteristics of the memory device using the output voltage of the variable voltage generation circuit and thus the performance of the memory device may be enhanced.

BRIEF DESCRIPTION OF THE DRAWINGS

Example embodiments of the present disclosure will be more clearly understood from the following detailed description taken in conjunction with the accompanying drawings.

DETAILED DESCRIPTION OF THE EMBODIMENTS

Figure 1:
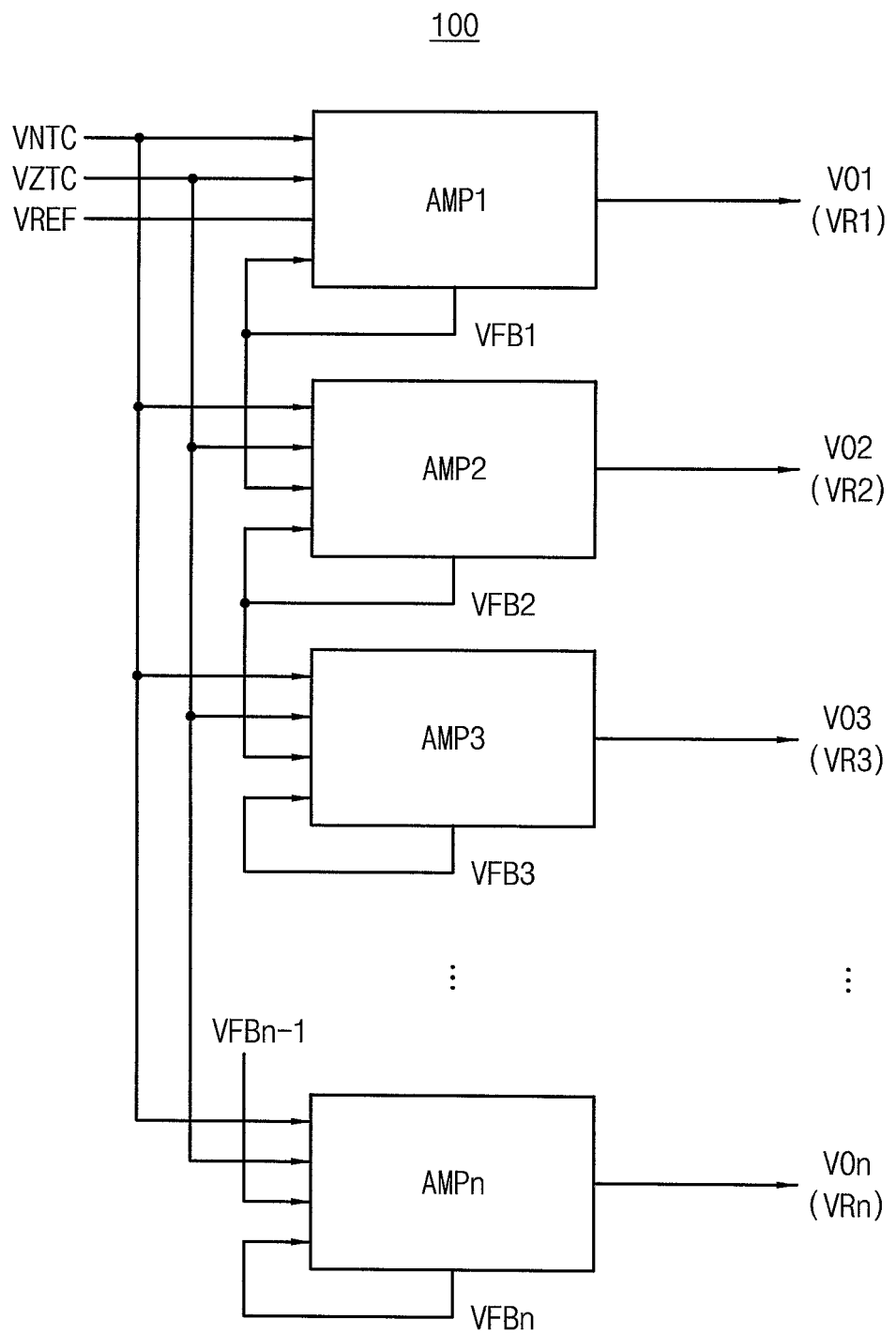
FIG. 1 is a block diagram illustrating a variable voltage generation circuit according to example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. Rather, these example embodiments are provided so that this disclosure will be thorough and complete, and will fully convey the scope of the present disclosure to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a variable voltage generation circuit according to example embodiments.

Referring to FIG. 1, a variable voltage generation circuit 100 includes first through n-th amplification circuits AMP1~AMPn.

The first amplification circuit AMP1 generates a first output voltage VO1 based on a reference voltage VREF, a first feedback voltage VFB1, a temperature-varied voltage VNTC that is varied depending on an operational temperature and a temperature-fixed voltage VZTC that is fixed regardless of the operational temperature, such that the first output voltage VO1 is varied in a first voltage range VR1 according to a variation of the operational temperature. The first amplification circuit AMP1 generates the first feedback voltage VFB1 based on the first output voltage VO1.

The k-th amplification circuit (k is an integer greater than 1 and smaller than or equal to n) AMPk generates a k-th output voltage VOk based on the (k−1)-th feedback voltage VFBk−1, a k-th feedback voltage VFBk, the temperature-varied voltage VNTC and the temperature-fixed voltage VZTC such that the k-th output voltage VOk is varied in a k-th voltage range VRk wider than the (k−1)-th voltage range VRk−1 according to the variation of the operational temperature. The k-th amplification circuit AMPk generates the k-th feedback voltage VFBk based on the k-th output voltage VOk.

The second amplification circuit AMP2 generates the second output voltage VO2 based on the first feedback voltage VFB1, the second feedback voltage VFB2, the temperature-varied voltage VNTC and the temperature-fixed voltage VZTC such that the second output voltage VO2 is varied in the second voltage range VR2 wider than the first voltage range VR1 according to the variation of the operational temperature, and generates the second feedback voltage VFB2 based on the second output voltage VO2. The third amplification circuit AMP3 generates the third output voltage VO3 based on the second feedback voltage VFB2, the third feedback voltage VFB3, the temperature-varied voltage VNTC and the temperature-fixed voltage VZTC such that the third output voltage VO3 is varied in the third voltage range VR3 wider than the second voltage range VR2 according to the variation of the operational temperature, and generates the third feedback voltage VFB3 based on the third output voltage VO3. In this way, the n-th amplification circuit AMPn generates the n-th output voltage VOn based on the (n−1)-th feedback voltage VFBn−1, the n-th feedback voltage VFBn, the temperature-varied voltage VNTC and the temperature-fixed voltage VZTC such that the n-th output voltage VOn is varied in the n-th voltage range VRn wider than the (n−1)-th voltage range VRn−1 according to the variation of the operational temperature, and generates the n-th feedback voltage VFBn based on the n-th output voltage VOn.

The amplification circuits AMP1~AMPn may have respective voltage offsets depending on the operational temperature as will be described below. The feedback voltage VFBk−1 of the previous amplification circuit AMPk−1 is provided to the next amplification circuit AMPk as a reference voltage according to example embodiments. By performing a differential amplification using the feedback voltage VFBk−1 from the previous amplification circuit AMPk−1, the next amplification circuit AMPk may accumulate the voltage offsets and thus the output voltage range with respect to the operational temperature range may be expanded through the accumulation of the voltage offsets.

In the conventional schemes, one variable gain amplifier has been used to amplify the temperature-varied voltage VNTC and the amplified voltage has been used for expansion of the voltage range. As described with reference to FIG. 11, however, linearity cannot be secured when the current is increased monotonously using the one variable gain amplifier.

The variable voltage generation circuit 100 according to example embodiments may expand the output voltage range with respect to the operational temperature range and enhance linearity through the multiple feedback operations using the plurality of amplification circuits AMP1~AMPn having voltage offsets depending on the operational temperature.

Figure 2:
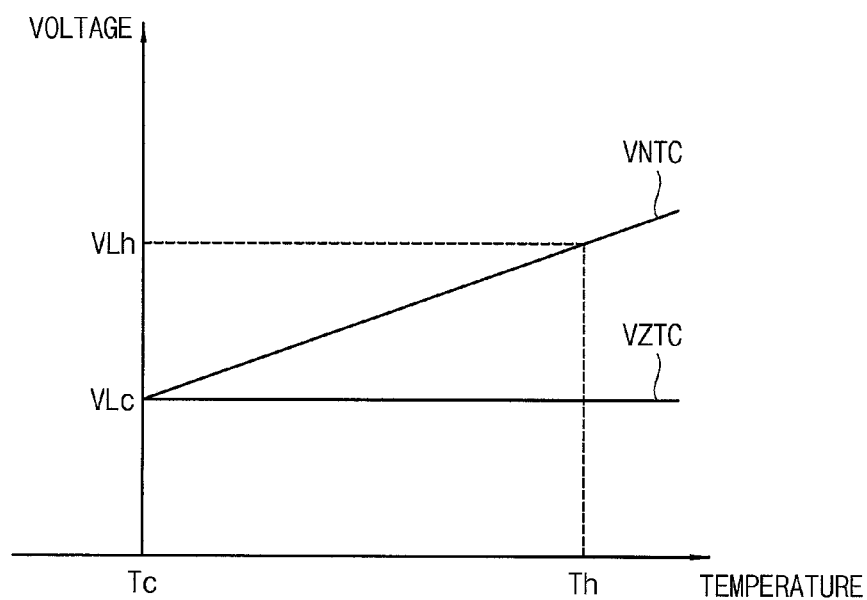
FIG. 2 is a diagram illustrating an example of a temperature-varied voltage and a temperature-fixed voltage provided to the variable voltage generation circuit of FIG. 1.
Figure 3:
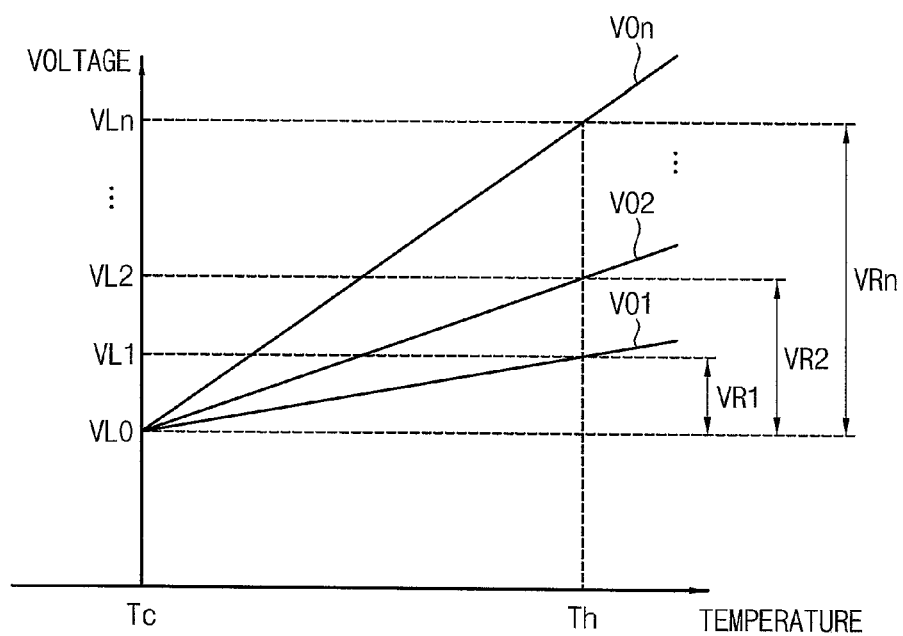
FIG. 3 is a diagram illustrating an example of an output voltage range of the variable voltage generation circuit of FIG. 1 with respect to a change of an operational temperature.

FIG. 2 is a diagram illustrating an example of a temperature-varied voltage and a temperature-fixed voltage provided to the variable voltage generation circuit of FIG. 1, and FIG. 3 is a diagram illustrating an example of an output voltage range of the variable voltage generation circuit of FIG. 1 with respect to a change of an operational temperature.

Figure 16:
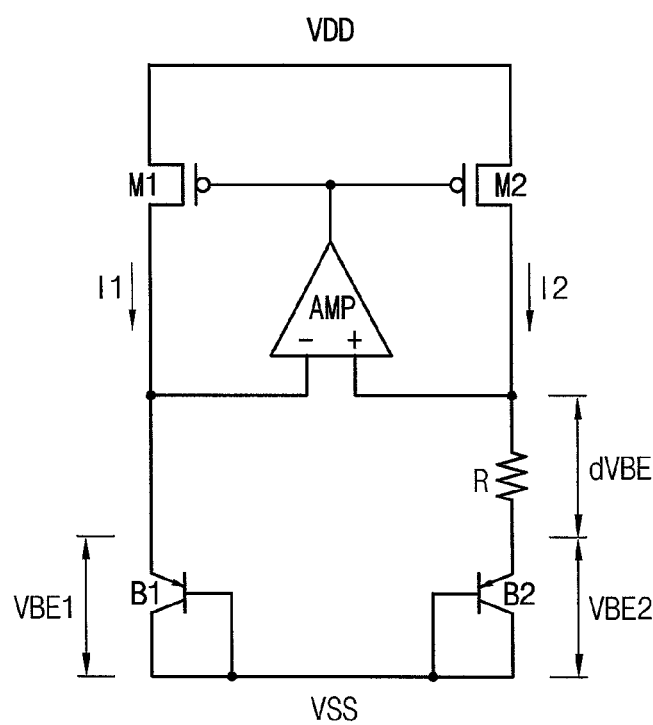
FIG. 16 is a circuit diagram illustrating an example of a temperature sensor included in the digital thermometer of FIG. 15.

Referring to FIG. 2, the temperature-varied voltage VNTC may have a voltage level that is varied depending on the operational temperature. For example, the temperature-varied voltage VNTC may increase as the operational temperature increases. As illustrated in FIG. 2, the temperature-varied voltage VNTC may have a first voltage level VLc at a first temperature Tc and a second voltage level VLh higher than the first voltage level VLc at a second temperature Th higher than the first temperature Tc. In some example embodiments, the temperature-varied voltage VNTC may be provided using an on-chip sensor that is integrated together with a variable voltage generation circuit 100 as illustrated in FIG. 16. In other example embodiments, the temperature-varied voltage VNTC may be provided using a separate temperature sensor chip.

The temperature-fixed voltage VZTC may have a voltage level that is fixed regardless of the operational temperature. FIG. 2 illustrates a non-limiting example in which the temperature-fixed voltage VZTC has the first voltage level VLc and the voltage level of the temperature-fixed voltage VZTC may be determined variously. In some example embodiments, the temperature-fixed voltage VZTC may be provided using a band gap reference circuit.

Referring to FIG. 3, the first though n-th output voltages VO1~VOn respectively provided from the first through n-th amplification circuits AMP1~AMPn may increase as the operational temperature increases. For example, the first through n-th output voltages VO1~VOn may have a reference voltage level VL0 at the first temperature Tc and respective voltage levels VL1~VLn higher than the reference voltage level VL0 at the second temperature Th higher than the first temperature Tc.

As illustrated in FIG. 3, the voltage range VRk of the output voltage VOk from the next amplification circuit AMPk may be wider than the voltage range VRk−1 of the output voltage VOk−1 from the previous amplification circuit AMPk−1. In other words, the voltage range VR2=VL0~VL2 of the second output voltage VO2 may be wider than the voltage range VR1=VL0~VL1 of the first output voltage VO1, the voltage range VR3=VL0~VL3 of the third output voltage VO3 may be wider than the voltage range VR2=VL0~VL2 of the second output voltage VO2 and in this way the voltage range VR2=VL0~VLn of the n-th output voltage VOn may be wider than the voltage range VRn−1=VL0~VLn−1 of the (n−1)-th output voltage VOn−1. As a result, the voltage range VRn of the n-th output voltage may be widest.

As such, the variable voltage generation circuit 100 according to example embodiments may expand the output voltage range with respect to the operational temperature range and enhance linearity through the multiple feedback operations using the plurality of amplification circuits AMP1~AMPn having voltage offsets depending on the operational temperature.

Figure 4:
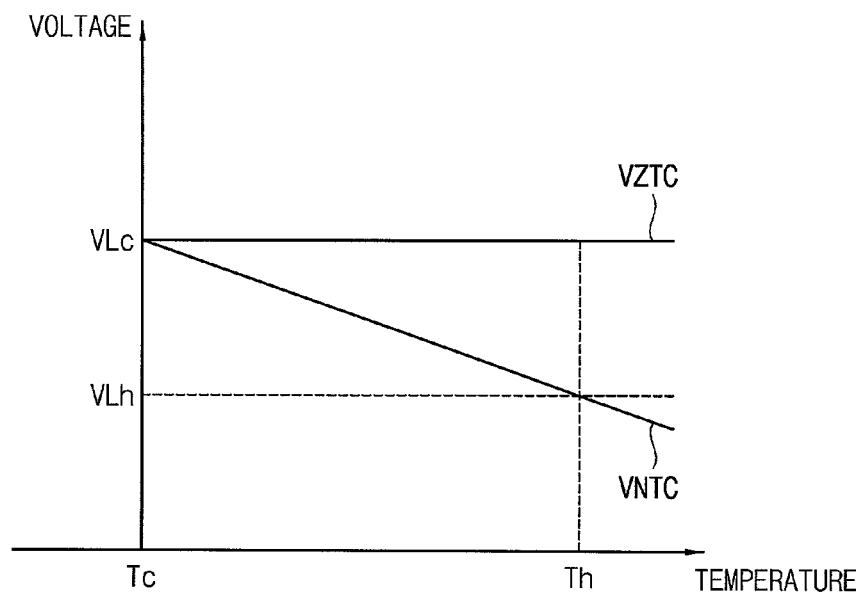
FIG. 4 is a diagram illustrating another example of a temperature-varied voltage and a temperature-fixed voltage provided to the variable voltage generation circuit of FIG. 1.
Figure 5:
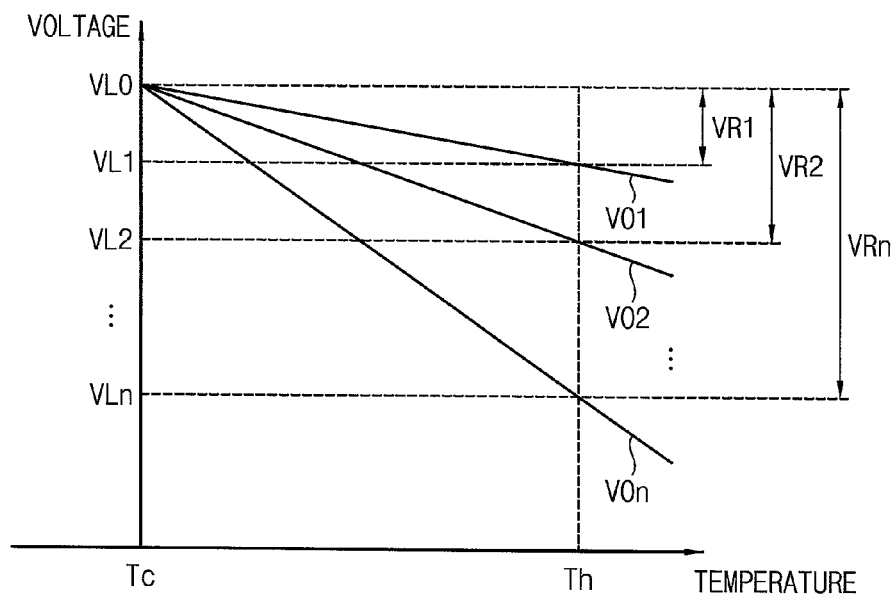
FIG. 5 is a diagram illustrating another example of an output voltage range of the variable voltage generation circuit of FIG. 1 with respect to a change of an operational temperature.

FIG. 4 is a diagram illustrating another example of a temperature-varied voltage and a temperature-fixed voltage provided to the variable voltage generation circuit of FIG. 1, and FIG. 5 is a diagram illustrating another example of an output voltage range of the variable voltage generation circuit of FIG. 1 with respect to a change of an operational temperature.

Referring to FIG. 4, the temperature-varied voltage VNTC may have a voltage level that is varied depending on the operational temperature. For example, the temperature-varied voltage VNTC may decrease as the operational temperature increases. As illustrated in FIG. 4, the temperature-varied voltage VNTC may have a first voltage level VLc at a first temperature Tc and a second voltage level VLh lower than the first voltage level VLc at a second temperature Th higher than the first temperature Tc. In some example embodiments, the temperature-varied voltage VNTC may be provided using an on-chip sensor that is integrated together with a variable voltage generation circuit 100 as illustrated in FIG. 16. In other example embodiments, the temperature-varied voltage VNTC may be provided using a separate temperature sensor chip.

The temperature-fixed voltage VZTC may have a voltage level that is fixed regardless of the operational temperature. FIG. 4 illustrates a non-limiting example that the temperature-fixed voltage VZTC has the first voltage level VLc and the voltage level of the temperature-fixed voltage VZTC may be determined variously. In some example embodiments, the temperature-fixed voltage VZTC may be provided using a band gap reference circuit.

Referring to FIG. 5, the first though n-th output voltages VO1~VOn respectively provided from the first through n-th amplification circuits AMP1~AMPn may decrease as the operational temperature increases. For example, the first through n-th output voltages VO1~VOn may have a reference voltage level VL0 at the first temperature Tc and respective voltage levels VL1~VLn lower than the reference voltage level VL0 at the second temperature Th higher than the first temperature Tc.

As illustrated in FIG. 5, the voltage range VRk of the output voltage VOk from the next amplification circuit AMPk may be wider than the voltage range VRk−1 of the output voltage VOk−1 from the previous amplification circuit AMPk−1. In other words, the voltage range VR2=VL0~VL2 of the second output voltage VO2 may be wider than the voltage range VR1=VL0~VL1 of the first output voltage VO1, the voltage range VR3=VL0~VL3 of the third output voltage VO3 may be wider than the voltage range VR2=VL0~VL2 of the second output voltage VO2 and in this way the voltage range VR2=VL0~VLn of the n-th output voltage VOn may be wider than the voltage range VRn−1=VL0~VLn−1 of the (n−1)-th output voltage VOn−1. As a result, the voltage range VRn of the n-th output voltage may be widest.

As such, the variable voltage generation circuit 100 according to example embodiments may expand the output voltage range with respect to the operational temperature range and enhance linearity through the multiple feedback operations using the plurality of amplification circuits AMP1~AMPn having voltage offsets depending on the operational temperature.

Figure 6:
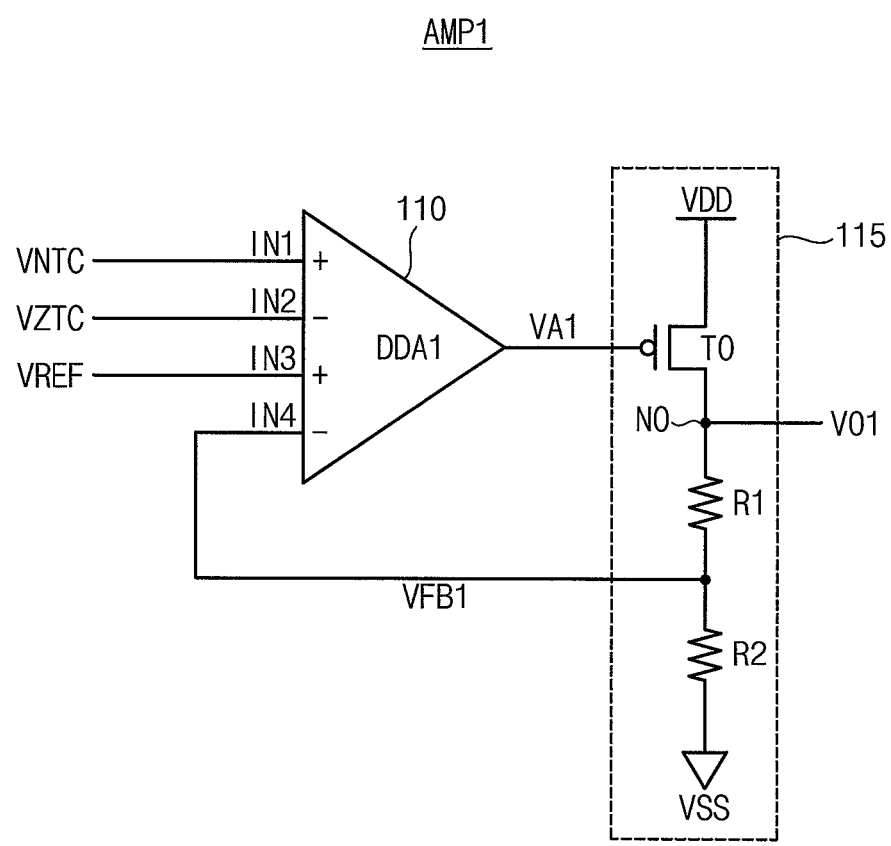
FIG. 6 is a diagram illustrating an example embodiment of a first amplification circuit included in the variable voltage generation circuit of FIG. 1.

FIG. 6 is a diagram illustrating an example embodiment of a first amplification circuit included in the variable voltage generation circuit of FIG. 1.

Referring to FIG. 6, a first amplification circuit AMP1 may include a first differential difference amplifier 110 and a first output circuit 115.

The first differential difference amplifier 110 may generate a first amplification voltage VA1 based on the reference voltage VREF, the first feedback voltage VFB1, the temperature-varied voltage VNTC and the temperature-fixed voltage VZTC. The first differential difference amplifier 110 may receive the temperature-varied voltage VNTC at a first input node IN1, the temperature-fixed voltage VZTC at a second input node IN2, the reference voltage VREF at a third input node IN3 and the first feedback voltage VFB1 at a fourth input node IN4. The first and second input nodes IN1 and IN2 receiving the temperature-varied voltage VNTC and the temperature-fixed voltage VZTC may form one differential input node pair and the third and fourth input nodes IN3 and IN4 receiving the reference voltage VREF and the first feedback voltage VFB1 may form another differential input node pair.

Using such two differential input node pairs, the first amplification circuit AMP1 may generate a first voltage offset OFF1 corresponding to a difference between the reference voltage VREF and the first feedback voltage VFB1, according to Expression 1, based on the temperature-varied voltage VNTC.

$$VFB1 = VREF + OFF1 \quad \text{Expression 1}$$

The first output circuit 115 may generate the first output voltage VO1 and the first feedback voltage VFB1 proportional to the first output voltage VO1 based on the first amplification voltage VA1. The first output circuit 115 may include an output amplification transistor TO connected between a power supply voltage VDD and an output node NO and first and second resistors R1 and R2 connected serially between the output node NO and a ground voltage VSS. The first output voltage VO1 may be provided at the output node NO and the first feedback voltage VFB1 defined by Expression 2 may be provided by dividing the first output voltage VO1 using the first and second resistors R1 and R2.

$$VFB1 = VO1 * [R2/(R1+R2)] \quad \text{Expression 2}$$

The reference voltage VREF may have a fixed voltage level regardless of the operational temperature. In this case, a changing amount of the first feedback voltage VFB1 depending on the temperature change corresponds to a changing amount of the first voltage offset OFF1 as represented by Expression 1. The first feedback voltage VFB1 may be proportional to the first output voltage VO1 as represented by Expression 2 and thus the first voltage range VR1 of the first output voltage VO1 may be proportional to the first voltage offset OFF1.

Figure 7:
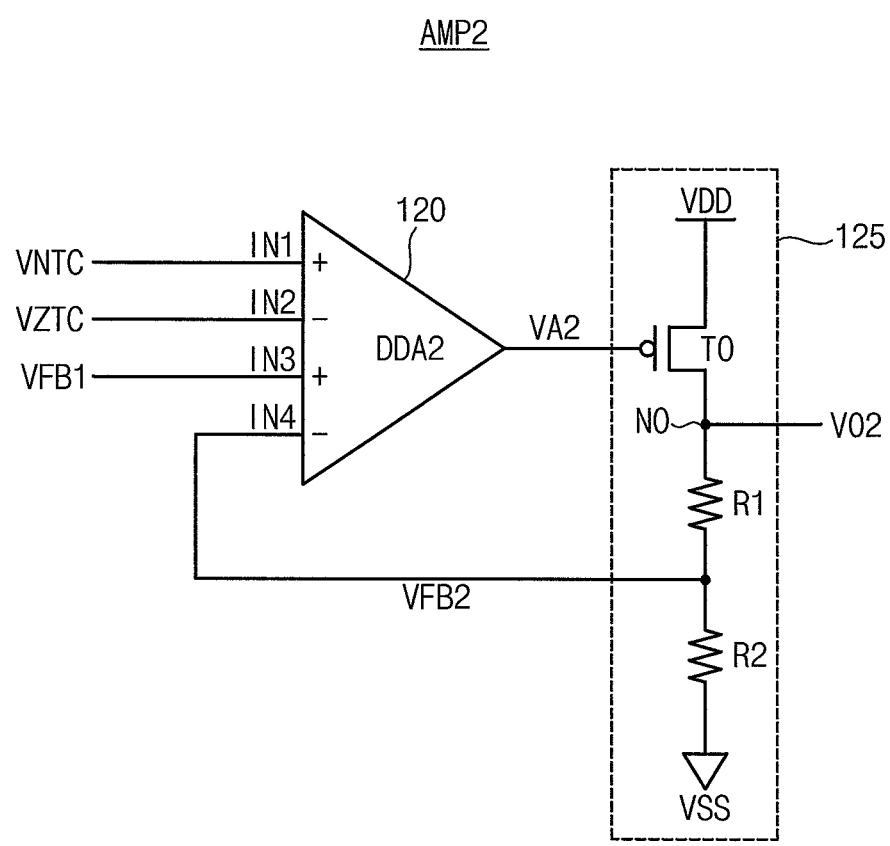
FIG. 7 is a diagram illustrating an example embodiment of a second amplification circuit included in the variable voltage generation circuit of FIG. 1.

FIG. 7 is a diagram illustrating an example embodiment of a second amplification circuit included in the variable voltage generation circuit of FIG. 1.

Referring to FIG. 7, a second amplification circuit AMP2 may include a second differential difference amplifier 120 and a second output circuit 125.

The second differential difference amplifier 120 may generate a second amplification voltage VA2 based on the first feedback voltage VFB1, the second feedback voltage VFB2, the temperature-varied voltage VNTC and the temperature-fixed voltage VZTC. The second differential difference amplifier 120 may receive the temperature-varied voltage VNTC at a first input node IN1, the temperature-fixed voltage VZTC at a second input node IN2, the first feedback voltage VFB1 at a third input node IN3 and the second feedback voltage VFB2 at a fourth input node IN4. The first and second input nodes IN1 and IN2 receiving the temperature-varied voltage VNTC and the temperature-fixed voltage VZTC may form one differential input node pair and the third and fourth input nodes IN3 and IN4 receiving the first feedback voltage VFB1 and the second feedback voltage VFB2 may form another differential input node pair. The second differential difference amplifier 120 in the second amplification circuit AMP2 of FIG. 7 receives the first feedback voltage VFB1 at the third input node IN3, which is provided from the first amplification circuit AMP1, whereas the first differential difference amplifier 110 in the first amplification circuit AMP1 of FIG. 6 receives the reference voltage VREF at the third input node IN3.

Using such two differential input node pairs, the second amplification circuit AMP2 may generate a second voltage offset OFF2 corresponding to a difference between the first feedback voltage VFB1 and the second feedback voltage VFB2, as expressed by Expression 3, based on the temperature-varied voltage VNTC.

$$VFB2 = VFB1 + OFF2 = VREF + OFF1 + OFF2 \quad \text{Expression 3}$$

The second output circuit 125 may generate the second output voltage VO2 and the second feedback voltage VFB2 proportional to the second output voltage VO2 based on the second amplification voltage VA2. The second output circuit 125 may include an output amplification transistor TO connected between the power supply voltage VDD and an output node NO and first and second resistors R1 and R2 connected serially between the output node NO and the ground voltage VSS. The second output voltage VO2 may be provided at the output node NO and the second feedback voltage VFB2, as expressed by Expression 4, may be provided by dividing the second output voltage VO2 using the first and second resistors R1 and R2.

$$VFB2 = VO2 * [R2/(R1+R2)] \quad \text{Expression 4}$$

The reference voltage VREF may have a fixed voltage level regardless of the operational temperature. In this case, a changing amount of the second feedback voltage VFB2 depending on the temperature change corresponds to a changing amount of a sum of the first voltage offset OFF1 and the second voltage offset OFF2 as represented by Expression 3. The second feedback voltage VFB2 may be proportional to the second output voltage VO2 as represented by Expression 4 and thus the second voltage range VR2 of the second output voltage VO2 may be proportional to the sum of the first voltage offset OFF1 and the second voltage offset OFF2.

In some example embodiments, the first amplification circuit AMP1 and the second amplification circuit AMP2 may have a same configuration. In this case, the first voltage offset OFF1 may be equal to the second voltage offset OFF2 and Expression 3 may be represented as Expression 5.

$$VFB2=VREF+OFF1+OFF2=VREF+2*OFF1 \quad \text{Expression 5}$$

Referring to Expressions 1 and 5, the second voltage range VR2 of the second output voltage VO2 may be twice the first voltage range VR1 of the first output voltage VO1 when the first amplification circuit AMP1 and the second amplification circuit AMP2 have the same configuration.

Figure 8:
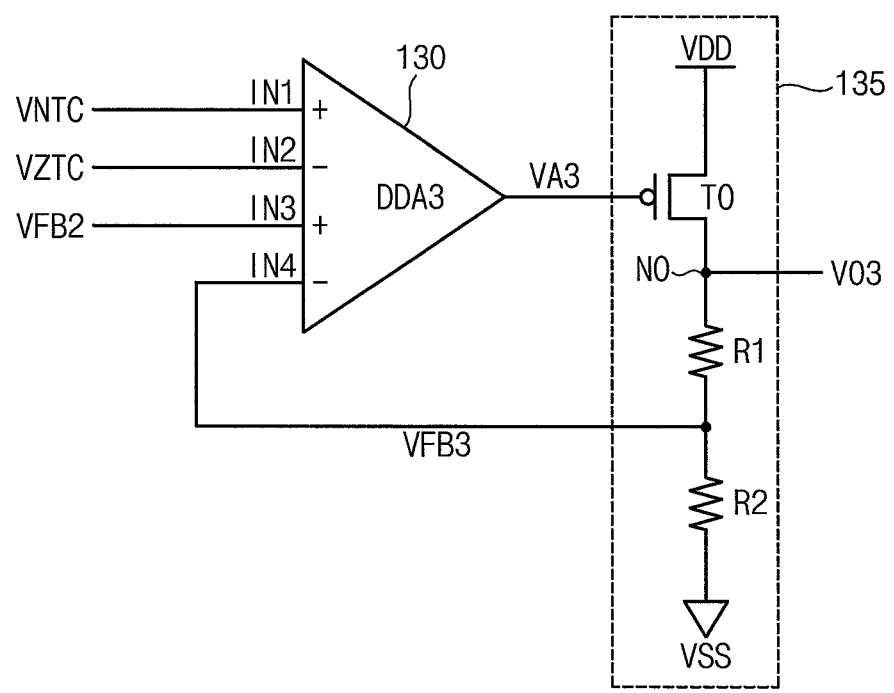
FIG. 8 is a diagram illustrating an example embodiment of a third amplification circuit included in the variable voltage generation circuit of FIG. 1.

FIG. 8 is a diagram illustrating an example embodiment of a third amplification circuit included in the variable voltage generation circuit of FIG. 1.

Referring to FIG. 8, a third amplification circuit AMP3 may include a third differential difference amplifier 130 and a third output circuit 135.

The third differential difference amplifier 130 may generate a third amplification voltage VA3 based on the second feedback voltage VFB2, the third feedback voltage VFB3, the temperature-varied voltage VNTC and the temperature-fixed voltage VZTC. The third differential difference amplifier 130 may receive the temperature-varied voltage VNTC at a first input node IN1, the temperature-fixed voltage VZTC at a second input node IN2, the second feedback voltage VFB2 at a third input node IN3 and the third feedback voltage VFB3 at a fourth input node IN4. The first and second input nodes IN1 and IN2 receiving the temperature-varied voltage VNTC and the temperature-fixed voltage VZTC may form one differential input node pair and the third and fourth input nodes IN3 and IN4 receiving the second feedback voltage VFB2 and the third feedback voltage VFB3 may form another differential input node pair. The third differential difference amplifier 130 in the third amplification circuit AMP3 of FIG. 8 receives the second feedback voltage VFB2 at the third input node IN3, which is provided from the second amplification circuit AMP2, whereas the second differential difference amplifier 120 in the second amplification circuit AMP2 of FIG. 7 receives the first feedback voltage VFB1 at the third input node IN3, which is provided from the first amplification circuit AMP1.

Using such two differential input node pairs, the third amplification circuit AMP3 may generate a third voltage offset OFF3 corresponding to a difference between the second feedback voltage VFB2 and the third feedback voltage VFB3, as expressed by Expression 6, based on the temperature-varied voltage VNTC.

$$VFB3=VFB2+OFF3=VREF+OFF1+OFF2+OFF3 \quad \text{Expression 6}$$

The third output circuit 135 may generate the third output voltage VO3 and the third feedback voltage VFB3 proportional to the third output voltage VO3 based on the third amplification voltage VA3. The third output circuit 135 may include an output amplification transistor TO connected between the power supply voltage VDD and an output node NO and first and second resistors R1 and R2 connected serially between the output node NO and the ground voltage VSS. The third output voltage VO3 may be provided at the output node NO and the third feedback voltage VFB2, as expressed by Expression 7, may be provided by dividing the third output voltage VO3 using the first and second resistors R1 and R2.

$$VFB3=VO3*[R2/(R1+R2)] \quad \text{Expression 7}$$

The reference voltage VREF may have a fixed voltage level regardless of the operational temperature. In this case, a changing amount of the third feedback voltage VFB3 depending on the temperature change corresponds to a changing amount of a sum of the first voltage offset OFF1, the second voltage offset OFF2 and the third voltage offset OFF3 as represented by Expression 6. The third feedback voltage VFB3 may be proportional to the third output voltage VO3 as represented by Expression 7 and thus the third voltage range VR3 of the third output voltage VO3 may be proportional to the sum of the first voltage offset OFF1, the second voltage offset OFF2 and the third voltage offset OFF3.

In some example embodiments, the first amplification circuit AMP1, the second amplification circuit AMP2 and the third amplification circuit AMP3 may have a same configuration. In this case, the first voltage offset OFF1, the second voltage offset and the third voltage offset OFF3 may be equal to each other and Expression 6 may be represented as Expression 8.

$$VFB3=VREF+OFF1+OFF2+OFF3=VREF+3*OFF1 \quad \text{Expression 8}$$

Referring to Expressions 1 and 8, the third voltage range VR3 of the third output voltage VO3 may be three times the first voltage range VR1 of the first output voltage VO1 when the first amplification circuit AMP1, the second amplification circuit AMP2 and the third amplification circuit AMP3 have the same configuration.

The example embodiments have been described such that the output voltage range depending on the operational temperature may be expanded sequentially using the three amplification circuits. Those skilled in the art may understood that the output voltage range may be further expanded using more of the amplification circuits.

Figure 9:
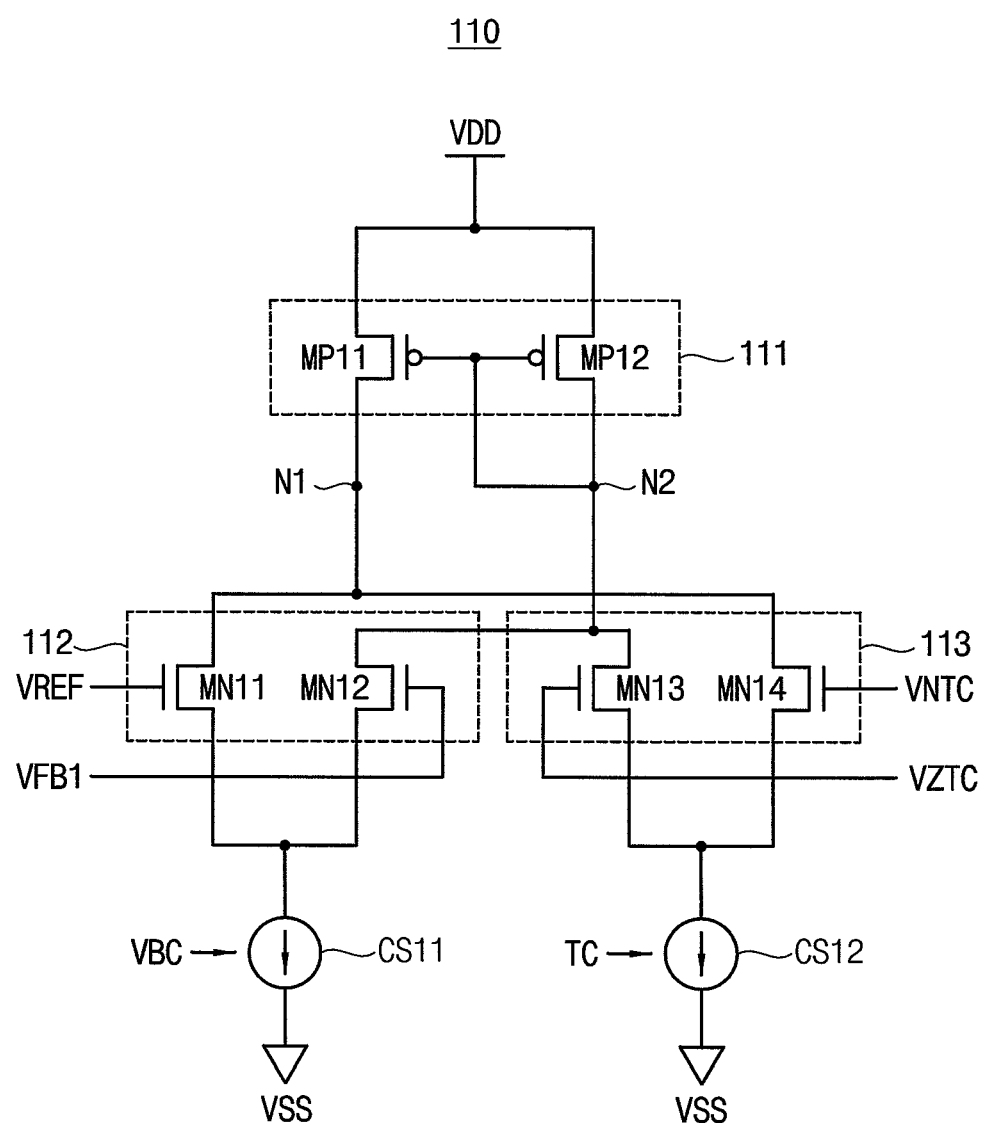
FIG. 9 is a diagram illustrating an example embodiment of a first differential difference amplifier included in the first amplification circuit of FIG. 6.
Figure 10:
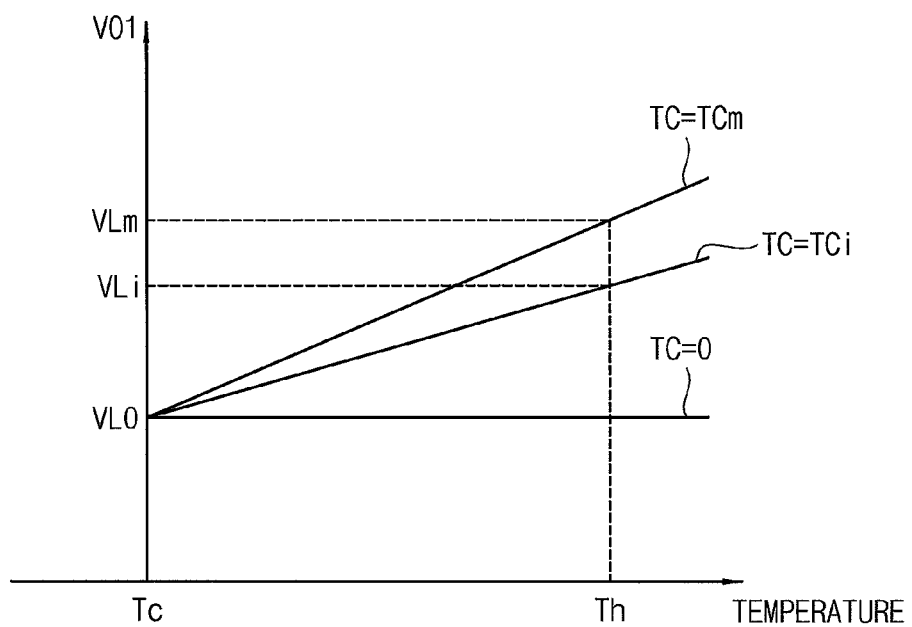
FIG. 10 is a diagram for describing a control of a first output voltage generated by the first differential difference amplifier of FIG. 9.
Figure 11:
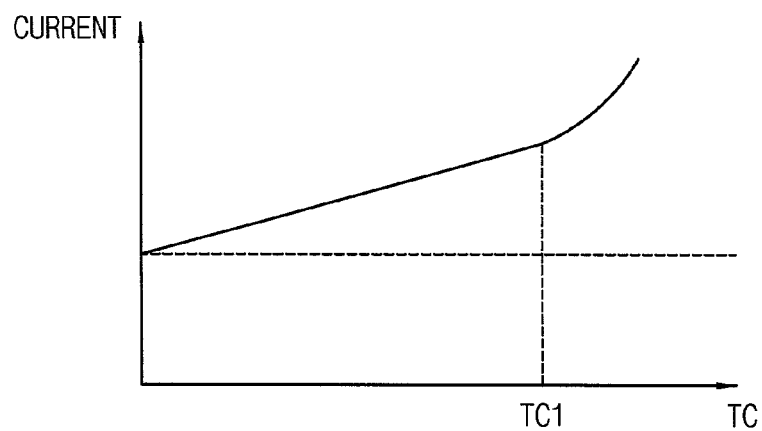
FIG. 11 is a diagram illustrating a tail current with respect to a temperature coefficient that is generated by a second current source included in the first differential difference amplifier of FIG. 9.

FIG. 9 is a diagram illustrating an example embodiment of a first differential difference amplifier included in the first amplification circuit of FIG. 6. FIG. 10 is a diagram for describing a control of a first output voltage generated by the first differential difference amplifier of FIG. 9 and FIG. 11 is a diagram illustrating a tail current with respect to a temperature coefficient that is generated by a second current source included in the first differential difference amplifier of FIG. 9.

Referring to FIG. 9, a first differential difference amplifier 110 may include a current mirror 111, a first input transistor pair 112, a second input transistor pair 113, a first current source CS11 and a second current source CS12. For example, the current mirror 111 may include P-type metal oxide semiconductor (PMOS) transistors MP11 and MP12, and the first and second input transistor pairs 112 and 113 may include N-type metal oxide semiconductor (NMOS) transistors MN11, MN12, MN13 and MN14.

The current mirror 111 may be connected to an output node pair N1 and N2 generating the first amplification voltage VA1 in FIG. 6. The first input transistor pair 112 may be connected to the output node pair N1 and N2 and may receive the reference voltage VREF and the first feedback voltage VFB1. The second input transistor pair 113 may be connected to the output node pair N1 and N2 and may receive the temperature-varied voltage VNTC and the temperature-fixed voltage VZTC. The first current source CS11 may be connected to the first input transistor pair 112 to provide a tail current or a bias current to the first input transistor pair 112, and the second current source CS12 may be connected to the second input transistor pair 113 to provide a tail current to the second input transistor pair 113.

The first current source CS11 may provide the tail current to the first input transistor pair 112 based on the bias signal VBC. The second current source CS12 may control the tail current to the second input transistor pair 113 based on a temperature coefficient signal TC to control the first voltage range VR1 of the first output voltage VO1. In this case, Expression 1 may be represented as Expression 9.

$$VFB1=VREF+OFF1=VREF+K*(VNTC-VZTC) \quad \text{Expression 9}$$

In Expression 9, K is a constant that is proportional to a control value of the temperature coefficient signal TC. For example, the second current source CS12 may have a structure that the tail current increases as the constant K increases. In this case, the first voltage range VR1 of the first output voltage VO1 may increase as the control value of the temperature coefficient signal TC increases. As illustrated in FIG. 10, the first voltage range VR1 of the first output voltage VO1 with respect to the temperature range Tc~Th may be maximized to VL0~VLm when the temperature coefficient signal TC has the maximum control value TCm and the first voltage range VR1 of the first output voltage VO1 with respect to the temperature range Tc~Th may be decreased to VL0~VLi when the temperature coefficient signal TC has the intermediate control value TCi. As such, the first voltage range VR1 of the first output voltage VO1 may be increased by increasing the control value of the temperature coefficient signal TC to increase the tail current of the second current source CS12. However the increase of the first voltage range VR1 by increasing the tail current of the second current source CS12 has a certain limit. As illustrated in FIG. 11, when the tail current of the current source is increased monotonously, the linearity is broken when the temperature coefficient signal TC has a control value greater than a threshold value TC1.

According to example embodiments, the output voltage range with respect to the operational temperature range may be expanded and linearity may be enhanced through the multiple feedback operations using a plurality of amplification circuits.

Figure 12:
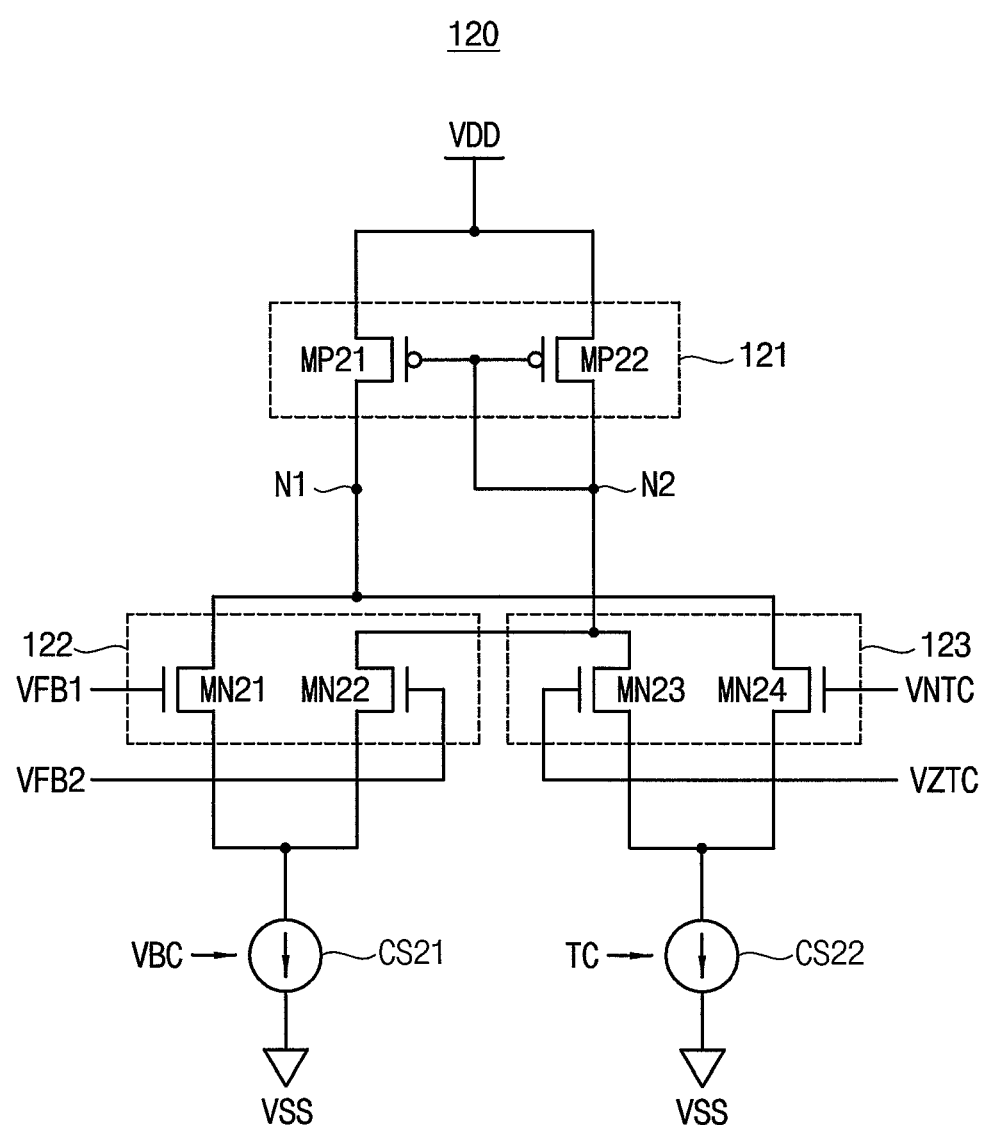
FIG. 12 is a diagram illustrating an example embodiment of a second differential difference amplifier included in the second amplification circuit of FIG. 7.

FIG. 12 is a diagram illustrating an example embodiment of a second differential difference amplifier included in the second amplification circuit of FIG. 7.

Referring to FIG. 12, a second differential difference amplifier 120 may include a current mirror 121, a first input transistor pair 122, a second input transistor pair 123, a first current source CS21 and a second current source CS22. For example, the current mirror 121 may include P-type metal oxide semiconductor (PMOS) transistors MP21 and MP22, and the first and second input transistor pairs 122 and 123 may include N-type metal oxide semiconductor (NMOS) transistors MN21, MN22, MN23 and MN24.

The current mirror 121 may be connected to an output node pair N1 and N2 generating the second amplification voltage VA2 in FIG. 7. The first input transistor pair 122 may be connected to the output node pair N1 and N2 and may receive the first feedback voltage VFB1 and the second feedback voltage VFB2. The second input transistor pair 123 may be connected to the output node pair N1 and N2 and may receive the temperature-varied voltage VNTC and the temperature-fixed voltage VZTC. The first input transistor pair 122 of the second differential difference amplifier 120 of FIG. 12 receives the first feedback voltage VFB1 and the second feedback voltage VFB2 to perform a differential amplification, whereas the first input transistor pair 112 of the first differential difference amplifier 110 of FIG. 9 receives the reference voltage VREF and the first feedback voltage VFB1 to perform a differential amplification. As such, through sequential feedback operations, the second amplification circuit AMP2 including the second differential difference amplifier 120 may generate the second output voltage VO2 having the second voltage range VR2 wider than the first voltage range VR1 of the first output voltage VO1 generated from the first amplification circuit AMP1 including the first differential difference amplifier 110.

The first current source CS21 may be connected to the first input transistor pair 122 to provide a tail current or a bias current to the first input transistor pair 122, and the second current source CS22 may be connected to the second input transistor pair 123 to provide a tail current to the second input transistor pair 123.

The first current source CS21 may provide the tail current to the first input transistor pair 122 based on the bias signal VBC. The second current source CS22 may control the tail current to the second input transistor pair 123 based on the temperature coefficient signal TC to control the second voltage range VR2 of the second output voltage VO2, as described with reference to FIG. 10.

Figure 13:
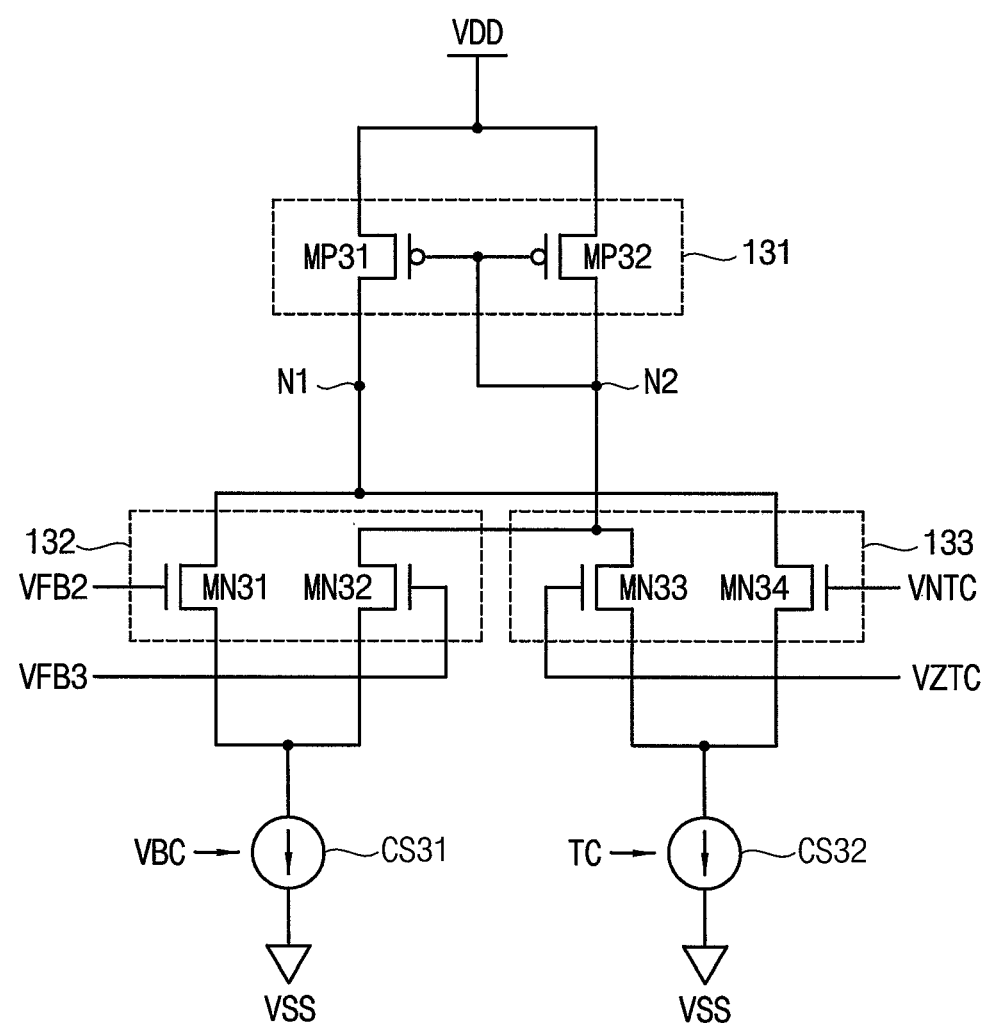
FIG. 13 is a diagram illustrating an example embodiment of a third differential difference amplifier included in the third amplification circuit of FIG. 8.

FIG. 13 is a diagram illustrating an example embodiment of a third differential difference amplifier included in the third amplification circuit of FIG. 8.

Referring to FIG. 13, a third differential difference amplifier 130 may include a current mirror 131, a first input transistor pair 132, a second input transistor pair 133, a first current source CS31 and a second current source CS32. For example, the current mirror 131 may include P-type metal oxide semiconductor (PMOS) transistors MP31 and MP32, and the first and second input transistor pairs 132 and 133 may include N-type metal oxide semiconductor (NMOS) transistors MN31, MN32, MN33 and MN34.

The current mirror 131 may be connected to an output node pair N1 and N2 generating the third amplification voltage VA3 in FIG. 8. The first input transistor pair 132 may be connected to the output node pair N1 and N2 and may receive the second feedback voltage VFB2 and the third feedback voltage VFB3. The second input transistor pair 133 may be connected to the output node pair N1 and N2 and may receive the temperature-varied voltage VNTC and the temperature-fixed voltage VZTC. The first input transistor pair 132 of the third differential difference amplifier 130 of FIG. 13 receives the second feedback voltage VFB2 and the third feedback voltage VFB3 to perform a differential amplification, whereas the first input transistor pair 122 of the second differential difference amplifier 120 of FIG. 12 receives the first feedback voltage VFB1 and the second feedback voltage VFB2 to perform a differential amplification. As such, through sequential feedback operations, the third amplification circuit AMP3 including the third differential difference amplifier 130 may generate the third output voltage VO3 having the third voltage range VR3 wider than the second voltage range VR2 of the second output voltage VO2 generated from the second amplification circuit AMP2 including the second differential difference amplifier 120.

The first current source CS31 may be connected to the first input transistor pair 132 to provide a tail current or a bias current to the first input transistor pair 132, and the second current source CS32 may be connected to the second input transistor pair 133 to provide a tail current to the second input transistor pair 133.

The first current source CS31 may provide the tail current to the first input transistor pair 132 based on the bias signal VBC. The second current source CS32 may control the tail current to the second input transistor pair 133 based on the temperature coefficient signal TC to control the third voltage range VR3 of the second output voltage VO3, as described with reference to FIG. 10.

Figure 14:
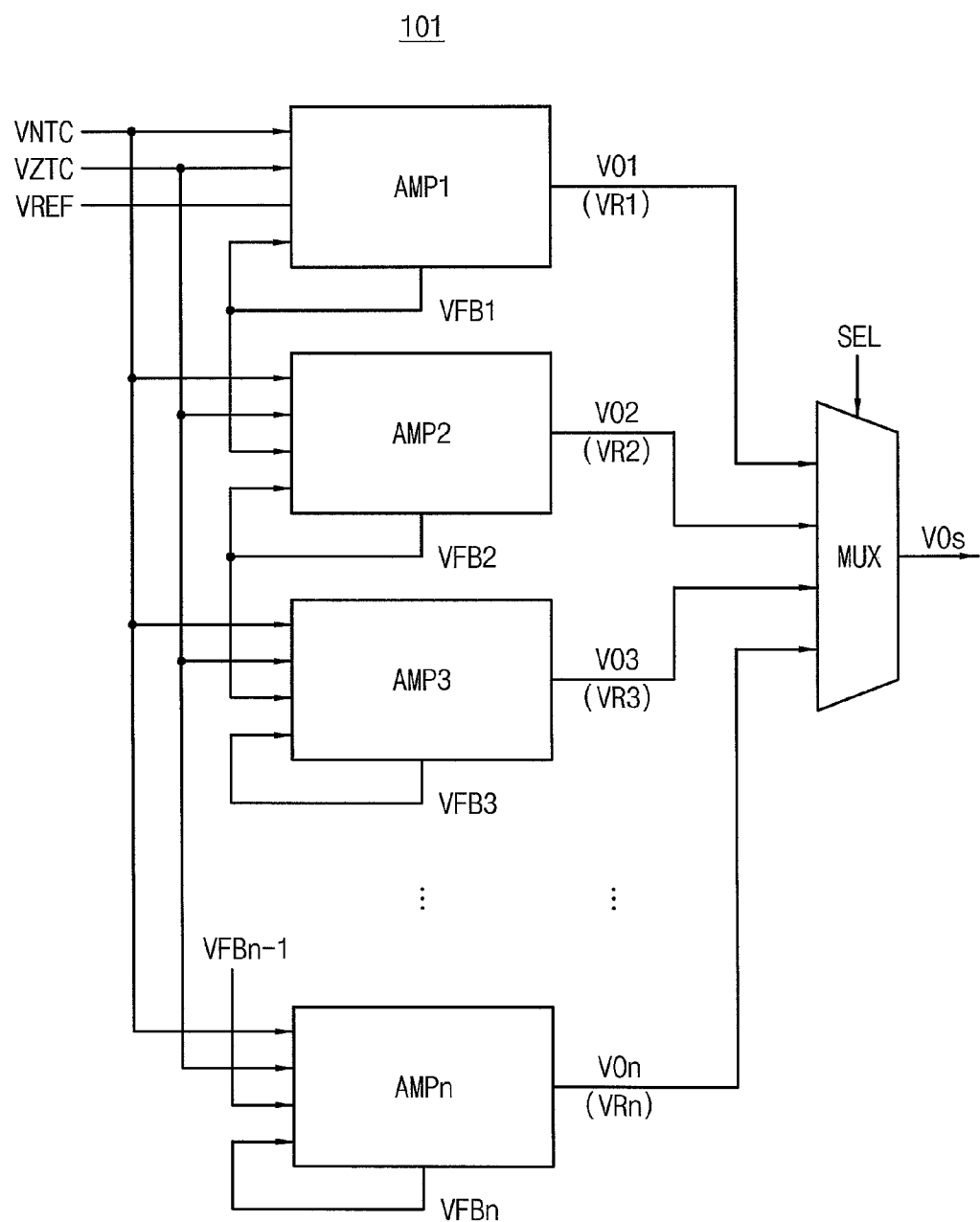
FIG. 14 is a block diagram illustrating a variable voltage generation circuit according to example embodiments.

FIG. 14 is a block diagram illustrating a variable voltage generation circuit according to example embodiments.

Referring to FIG. 14, a variable voltage generation circuit 101 includes first through n-th amplification circuits AMP1~AMPn and a selector MUX.

The first amplification circuit AMP1 generates a first output voltage VO1 based on a reference voltage VREF, a first feedback voltage VFB1, a temperature-varied voltage VNTC that is varied depending on an operational temperature and a temperature-fixed voltage VZTC that is fixed regardless of the operational temperature, such that the first output voltage VO1 is varied in a first voltage range VR1 according to a variation of the operational temperature. The first amplification circuit AMP1 generates the first feedback voltage VFB1 based on the first output voltage VO1.

The k-th amplification circuit (k is an integer greater than 1 and smaller than or equal to n) AMPk generates a k-th output voltage VOk based on the (k−1)-th feedback voltage VFBk−1, a k-th feedback voltage VFBk, the temperature-varied voltage VNTC and the temperature-fixed voltage VZTC such that the k-th output voltage VOk is varied in a k-th voltage range VRk wider than the (k−1)-th voltage range VRk−1 according to the variation of the operational temperature. The k-th amplification circuit AMPk generates the k-th feedback voltage VFBk based on the k-th output voltage VOk.

The second amplification circuit AMP2 generates the second output voltage VO2 based on the first feedback voltage VFB1, the second feedback voltage VFB2, the temperature-varied voltage VNTC and the temperature-fixed voltage VZTC such that the second output voltage VO2 is varied in the second voltage range VR2 wider than the first voltage range VR1 according to the variation of the operational temperature, and generates the second feedback voltage VFB2 based on the second output voltage VO2. The third amplification circuit AMP3 generates the third output voltage VO3 based on the second feedback voltage VFB2, the third feedback voltage VFB3, the temperature-varied voltage VNTC and the temperature-fixed voltage VZTC such that the third output voltage VO3 is varied in the third voltage range VR3 wider than the second voltage range VR2 according to the variation of the operational temperature, and generates the third feedback voltage VFB3 based on the third output voltage VO3. In this way, the n-th amplification circuit AMPn generates the n-th output voltage VOn based on the (n−1)-th feedback voltage VFBn−1, the n-th feedback voltage VFBn, the temperature-varied voltage VNTC and the temperature-fixed voltage VZTC such that the n-th output voltage VOn is varied in the n-th voltage range VRn wider than the (n−1)-th voltage range VRn−1 according to the variation of the operational temperature, and generates the n-th feedback voltage VFBn based on the n-th output voltage VOn.

The selector MUX may select one of the first through n-th output voltages VO1~VOn in response to a selection signal SEL to output a selected output voltage VOs. The variable voltage generation circuit 101 may select and output the output voltage having an appropriate voltage range with respect to the temperature range according to characteristics of devices and/or systems including the variable voltage generation circuit 101, and thus the operation of the devices and/or systems may be controlled efficiently.

Figure 15:
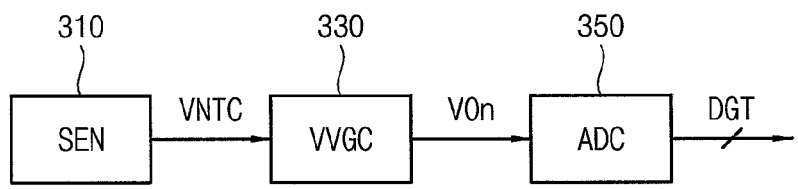
FIG. 15 is a block diagram illustrating a digital thermometer according to example embodiments.

FIG. 15 is a block diagram illustrating a digital thermometer according to example embodiments.

Referring to FIG. 15, a digital thermometer 300 includes a temperature sensor SEN 310, a variable voltage generation circuit VVGC 330 and an analog-to-digital converter ADC 350.

The temperature sensor 310 may generate a temperature-varied voltage VNTC that is varied depending on an operational temperature. In some example embodiments, the temperature sensor 310 may be an on-chip sensor that is integrated together with a variable voltage generation circuit 330 as illustrated in FIG. 16. In other example embodiments, the temperature sensor 310 may be a separate temperature sensor chip distinct from the variable voltage generation circuit 330.

The variable voltage generation circuit 330 may include a plurality of amplification circuits according to example embodiments. As described above, the variable voltage generation circuit 330 may provide an output voltage VOn having an expanded voltage range with respect to the operational temperature range and enhanced linearity through the multiple feedback operations using the plurality of amplification circuits.

The analog-to-digital converter 350 may convert the output voltage VOn of the variable voltage generation circuit 330 to digital signal DGT representing the operational temperature. The configuration of the analog-to-digital converter 350 may be implemented variously and the digital signal DGT may include multiple bits.

The digital thermometer 300 may measure the operational temperature exactly using the output voltage VOn having the expanded voltage range and the enhanced linearity.

FIG. 16 is a circuit diagram illustrating an example of a temperature sensor included in the digital thermometer of FIG. 15.

Referring to FIG. 16, a temperature sensor 312 may include first and second PMOS transistors M1 and M2, a feedback amplifier AMP, a resistor R and first and second bipolar transistors B1 and B2, which are coupled between a power supply voltage VDD and a ground voltage VSS as illustrated in FIG. 16. A voltage dVBE across the resistor R may be obtained, as expressed by Expression 10.

$$\begin{aligned} dVBE &= VBE1 - VBE2 \\ &= VT*\text{Ln}(Ic1/Is1) - VT*\text{Ln}(n*Ic2/Is2) \\ &= VT*\text{Ln}(n) \end{aligned} \qquad \text{Expression 10}$$

In Expression 10, Is1 and Is2 indicate reverse saturation currents of the bipolar transistors B1 and B2, Ic1 and Ic2 indicate currents flowing through the bipolar transistors B1 and B2, n is a gain ratio of the bipolar transistors B1 and B2, and VT indicates a temperature voltage that is proportional to an absolute temperature of the temperature sensor 312. Ln(n) is a constant value and thus the voltage dVBE across the resistor R and the current I2 flowing through the resistor R may be proportional to the temperature variation. As such, the temperature sensor 312 may provide the temperature-varied voltage VNTC based on the voltage dVBE that is proportional to the operational temperature.

Figure 17:
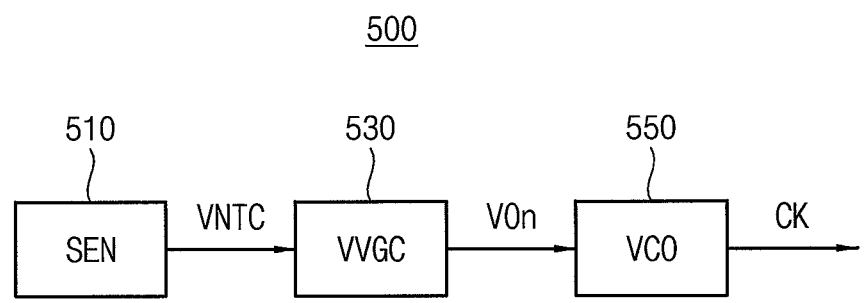
FIG. 17 is a block diagram illustrating a clock generator according to example embodiments.

FIG. 17 is a block diagram illustrating a clock generator according to example embodiments.

Referring to FIG. 17, a clock generator 500 includes a temperature sensor SEN 510, a variable voltage generation circuit VVGC 530 and a voltage-controlled oscillator VCO 550.

The temperature sensor 510 may generate a temperature-varied voltage VNTC that is varied depending on an operational temperature. In some example embodiments, the temperature sensor 510 may be an on-chip sensor that is integrated together with a variable voltage generation circuit 530 as illustrated in FIG. 16. In other example embodiments, the temperature sensor 510 may be a separate temperature sensor chip distinct from the variable voltage generation circuit 530.

The variable voltage generation circuit 530 may include a plurality of amplification circuits according to example embodiments. As described above, the variable voltage generation circuit 530 may provide an output voltage VOn having an expanded voltage range with respect to the operational temperature range and enhanced linearity through the multiple feedback operations using the plurality of amplification circuits.

The voltage-controlled oscillator 550 may generate a clock signal CK, which has a frequency that is varied depending on the operational temperature, based on the output voltage VOn of the variable voltage generation circuit 530.

The digital thermometer 500 may control the frequency of the clock signal CK exactly according to the operational temperature using the output voltage VOn having the expanded voltage range and the enhanced linearity.

Figure 18:
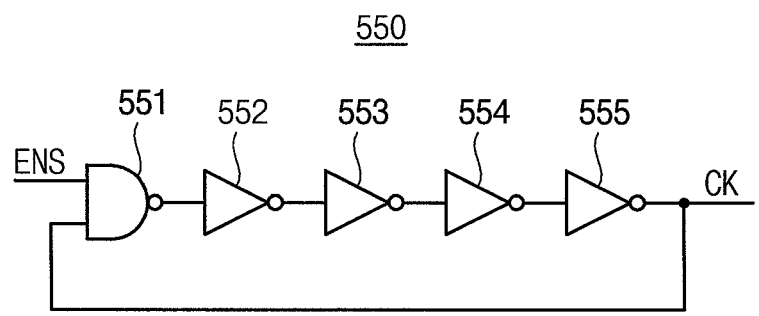
FIG. 18 is a diagram illustrating an example of a voltage-controlled oscillator included in the clock generator of FIG. 17.
Figure 19:
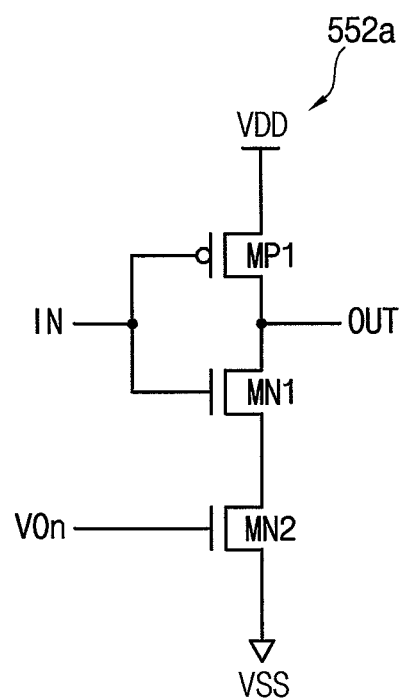
FIG. 19 is a diagram illustrating an example of an inverter included in the voltage-controlled oscillator of FIG. 18.

FIG. 18 is a diagram illustrating an example of a voltage-controlled oscillator included in the clock generator of FIG. 17, and FIG. 19 is a diagram illustrating an example of an inverter included in the voltage-controlled oscillator of FIG. 18.

In some example embodiments, the voltage-controlled oscillator may be implemented with a ring oscillator as illustrated in FIG. 18. The ring oscillator 550 may include a NAND logic gate 551 and inverters 552, 553, 554 and 555 that are cascade-coupled. The output of the last inverter 555 may be fed-back to the NAND logic gate 551. The ring oscillator may be enabled in response to the sensing enable signal ENS input to the NAND logic gate 551.

The NAND logic gate 551 and the inverters 552, 553, 554 and 555 have operational speeds proportional to the temperature and thus the frequency of the clock signal CK may be varied depending on the operational temperature.

Referring to FIG. 19, an inverter 552a may include a first PMOS transistor MP1, a first NMOS transistor MN1 and a second NMOS transistor MN2 that are cascade-coupled between the power supply voltage VDD and the ground voltage VSS. The output signal IN of a previous stage (the NAND logic gate or another inverter) is input to gate electrodes of the first PMOS transistor MP1 and the first NMOS transistor MN1. The inverted signal OUT is provided as an input to the next stage. The output voltage VOn of the variable voltage generation circuit 530 is applied to a gate electrode of the second NMOS transistor MN2. As the temperature increases, the sinking current flowing through the second NMOS transistor NM2 increases because the level of the output voltage VOn increases in proportion to the temperature. The operational speed of the inverter 552a may increase depending on the temperature, and thus the frequency of the clock signal CK from the voltage-controlled oscillator 500 may be increased in proportion to the operational temperature.

The digital thermometer 300 and the clock generator 500 according to example embodiments have been described with reference to FIGS. 15 through 19. The configurations of the digital thermometer 300 and the clock generator 500 are not limited to those of FIGS. 15 through 19 and may be modified variously. It would be understood that the variable voltage generation circuit according to example embodiments may be applied to arbitrary devices and systems other than the digital thermometer and the clock generator, which require the voltage having a variable voltage level depending on the operational temperature.

Figure 20:
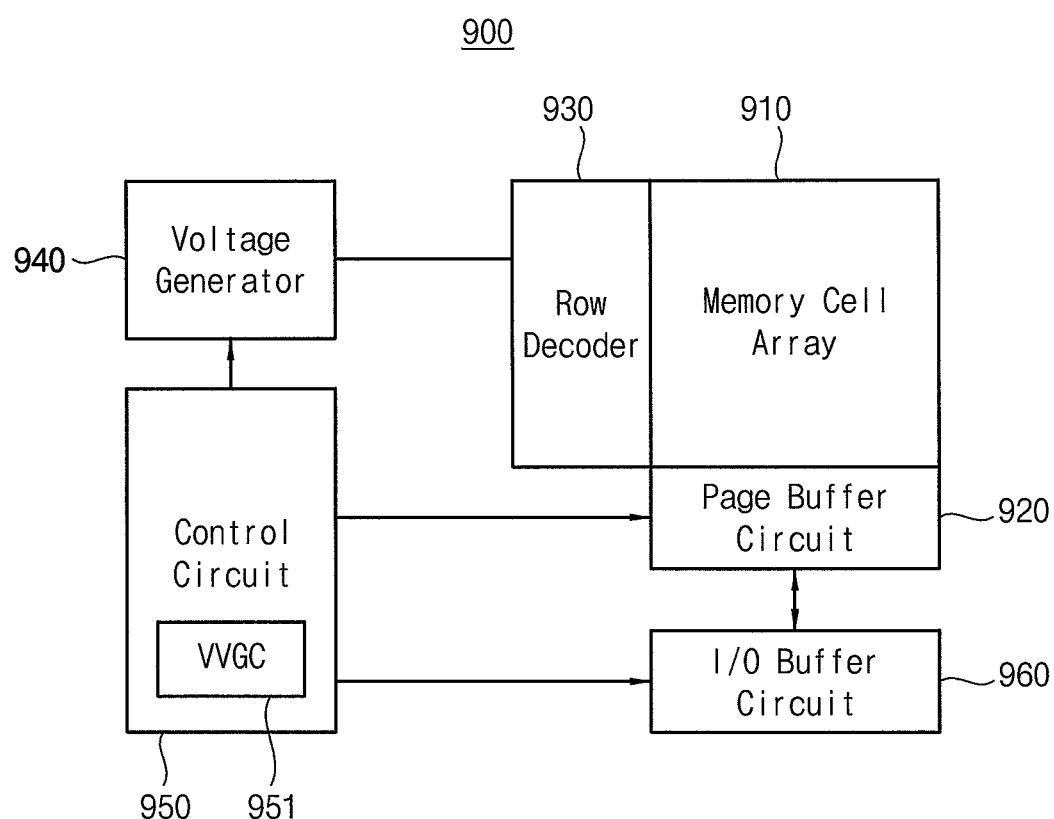
FIG. 20 is a block diagram illustrating a nonvolatile memory device according to example embodiments.

FIG. 20 is a block diagram illustrating a memory device according to example embodiments.

Referring to FIG. 20, a memory device 900 includes a memory cell array 910, a page buffer circuit 920, a row decoder 930, a voltage generator 940, an input/output buffer circuit 960, and a control circuit 950. In some example embodiments, the memory device 900 may be a flash memory device. In other example embodiments, the memory device 900 may be a nonvolatile memory device such as a phase random access memory (PRAM), a resistive random access memory (RRAM), a magnetic random access memory (MRAM), a ferroelectric random access memory (FRAM), etc. In still other example embodiments, the memory device 900 may be a volatile memory device such as a dynamic random access memory DRAM, a static random access memory, etc.

The memory cell array 910 may include a plurality of memory cells coupled to a plurality of word lines and a plurality of bit lines. As described below with reference to FIGS. 21 through 24, the plurality of memory cells may be NAND or NOR flash memory cells, and may be arranged in a two dimensional array structure or a three dimensional vertical array structure.

In some example embodiments, the memory cells may be SLCs, each of which stores one data bit therein, or MLCs, each of which stores a plurality of data bits therein. In the case of the MLC, a program scheme in a write mode may include various program schemes such as a shadow program scheme, a reprogram scheme or an on-chip buffered program scheme.

The page buffer circuit 920 may be coupled to the bit lines, and may store write data to be programmed in the memory cell array 910 or read data that are sensed from the memory cell array 910. That is, the page buffer circuit 920 may be operated as a write driver or a sensing amplifier according to an operation mode of the memory device 900. For example, the page buffer circuit 920 may be operated as the write driver in a write mode and as the sensing amplifier in a read mode. The input/output buffer circuit 960 may receive data to be programmed in the memory cell array 910 from an external memory controller, and may transmit data read from the memory cell array 910 to the memory controller.

The row decoder 930 may be coupled to the word lines, and may select at least one of the word lines in response to a row address. The voltage generator 940 may generate word line voltages, such as a program voltage, a pass voltage, a verification voltage, an erase voltage, a read voltage, etc. according to a control of the control circuit 950. The control circuit 950 may control the page buffer circuit 920, the row decoder 930, the voltage generator 940 and the input/output buffer circuit 960 to perform data storing, erasing and reading operations for the memory cell array 910.

The memory device 900 may include a variable voltage generation circuit VVGC 951. Even though FIG. 20 illustrates that the variable voltage generation circuit 951 is included in the control circuit 950, the variable voltage generation circuit 951 may be disposed at various positions in the memory device 900. The variable voltage generation circuit 951 may include a plurality of amplification circuits according to example embodiments. As described above, the variable voltage generation circuit 951 may provide an output voltage having an expanded voltage range with respect to the operational temperature range and enhanced linearity through the multiple feedback operations using the plurality of amplification circuits. Using the output voltage, the memory device 900 may control the operational characteristics such as the operational timing, voltage level, etc. exactly according to the operational temperature.

FIGS. 21, 22, 23 and 24 are diagrams illustrating examples of memory cell arrays included in the nonvolatile memory device of FIG. 20.

Figure 21:
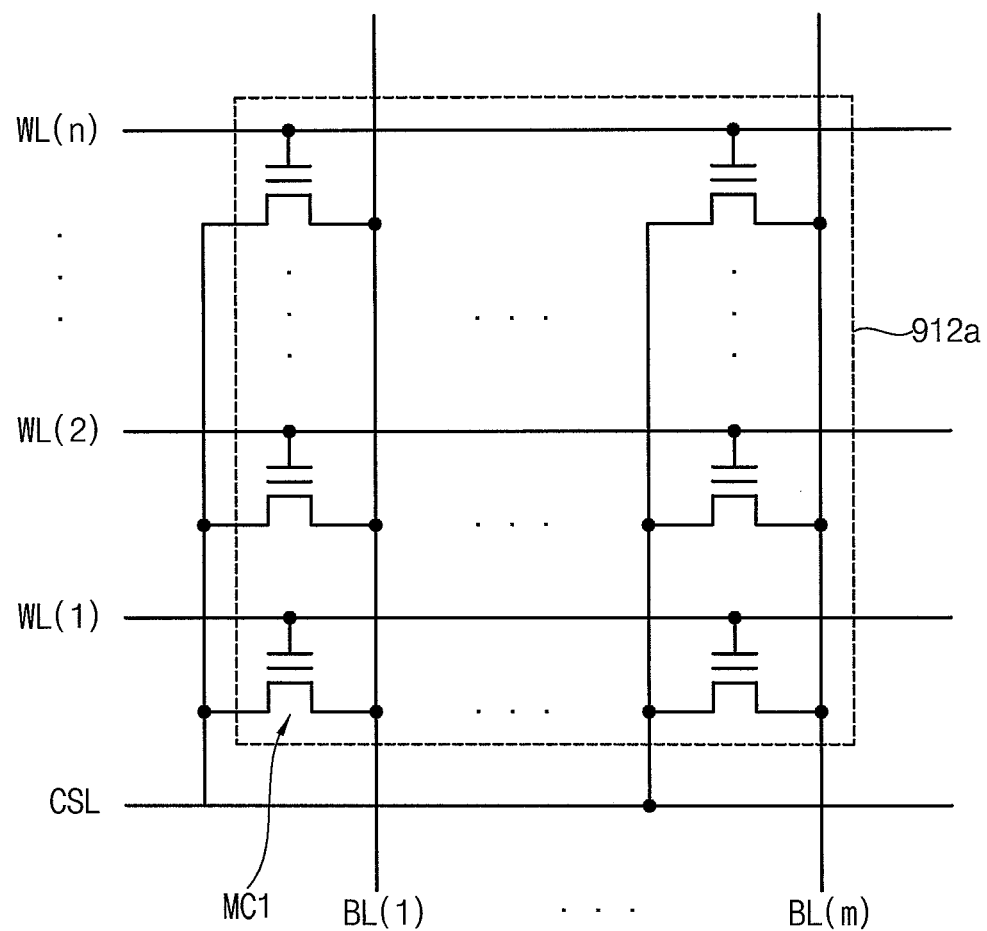
FIGS. 21, 22, 23 and 24 are diagrams illustrating examples of memory cell arrays included in the nonvolatile memory device of FIG. 20.
Figure 22:
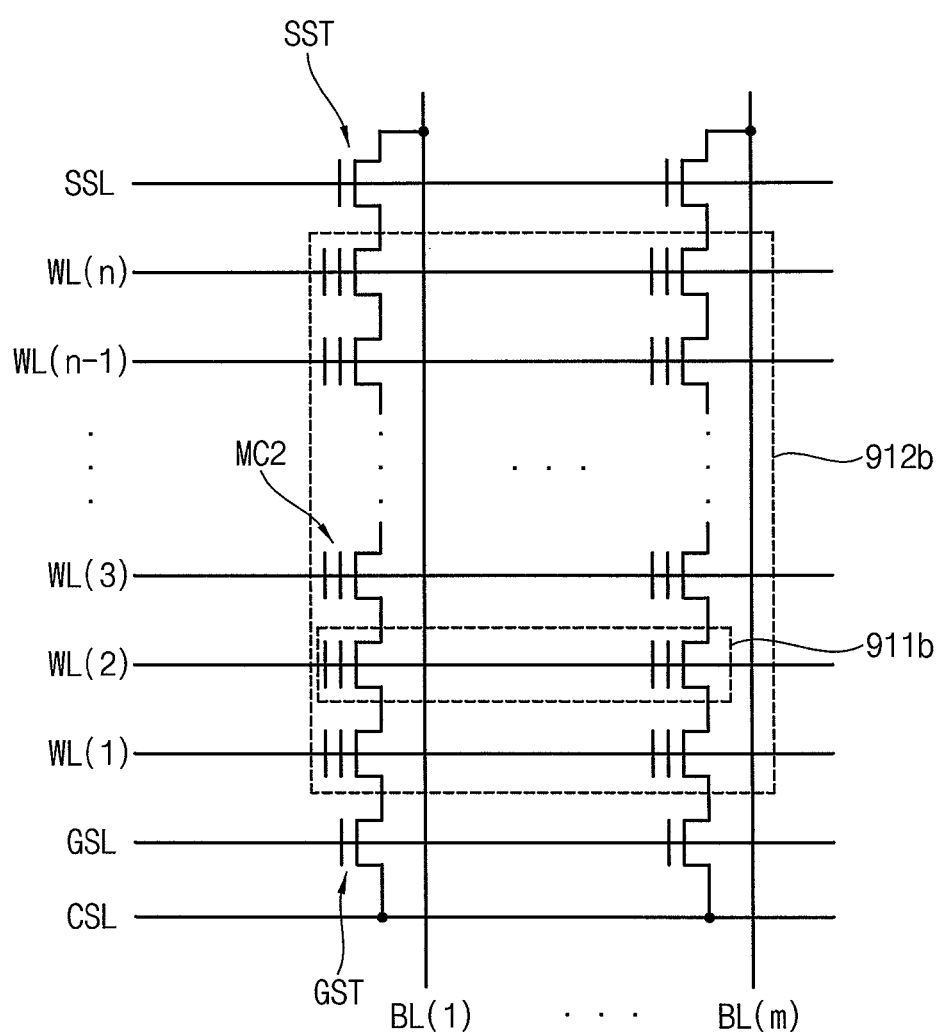
Figure 23:
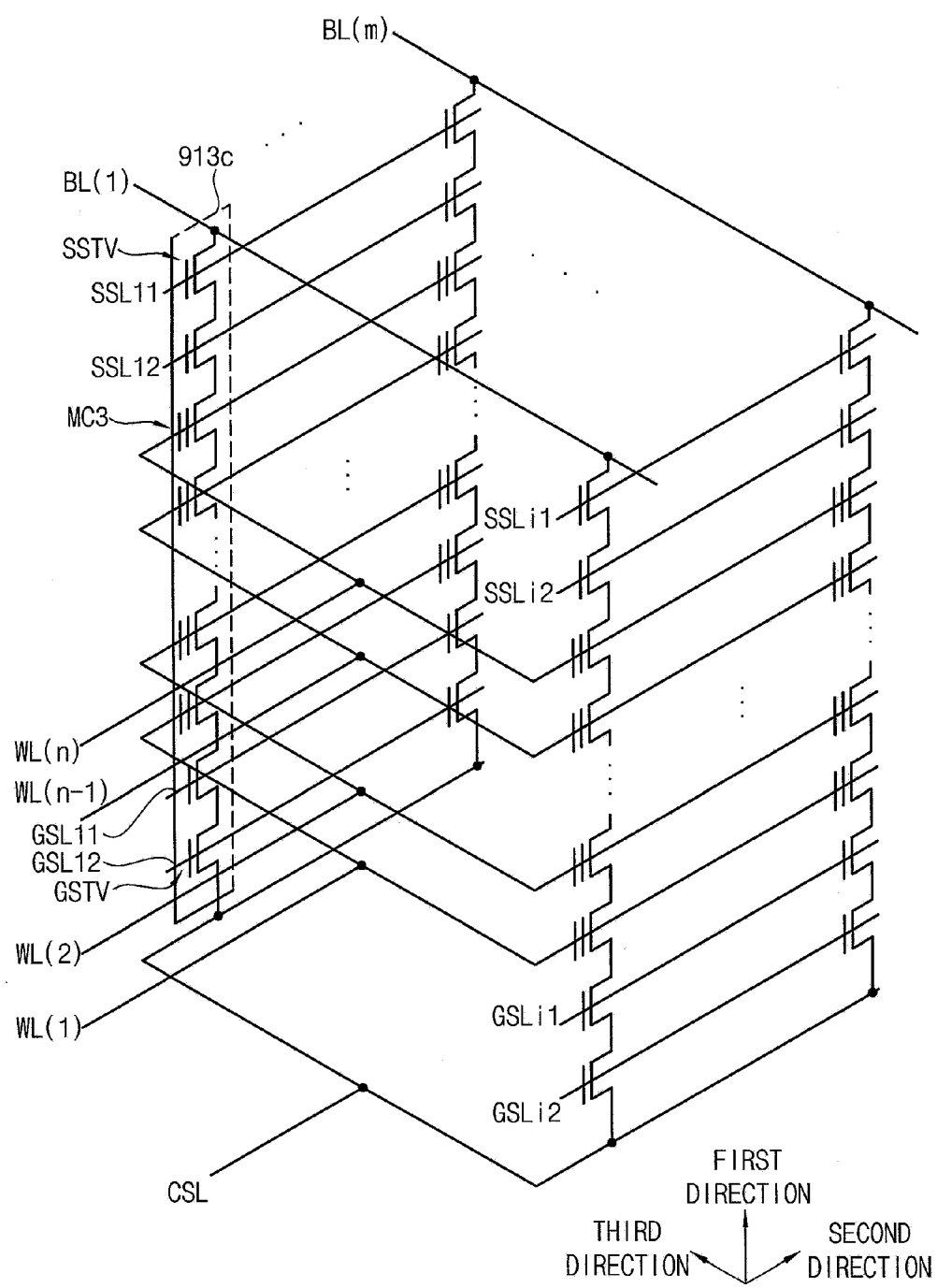
Figure 24:
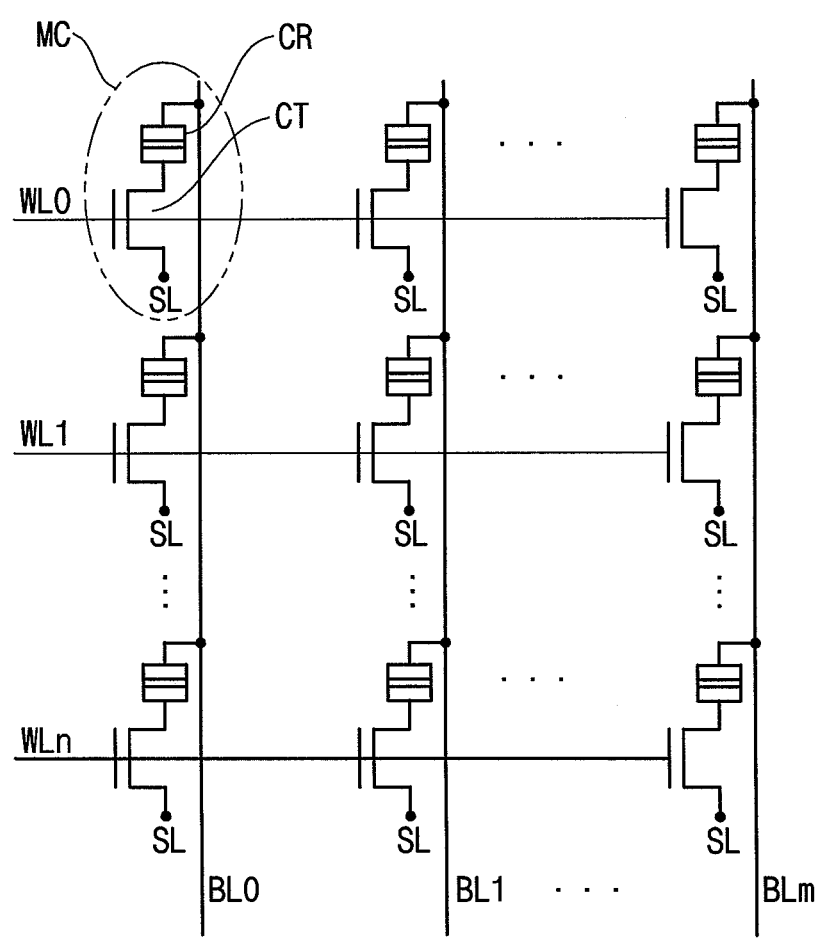

FIG. 21 is a circuit diagram illustrating an example of a memory cell array included in a NOR flash memory device. FIG. 22 is a circuit diagram illustrating an example of a memory cell array included in a NAND flash memory device. FIG. 23 is a circuit diagram illustrating an example of a memory cell array included in a vertical flash memory device. FIG. 24 is a circuit diagram illustrating an example of a memory cell array included in a resistive memory device.

Referring to FIG. 21, a memory cell array 910*a* may include a plurality of memory cells MC1. The memory cells MC1 arranged in the same row may be disposed in parallel between a respective one of bit lines BL(1), . . . , BL(m) and a common source line CSL, and may be coupled in common to one of word lines WL(1), WL(2), . . . , WL(n). For example, the memory cells arranged in a first row may be disposed in parallel between a respective one of bit lines BL(1), . . . , BL(m) and the common source line CSL. Gate electrodes of the memory cells arranged in the first row may be coupled in common to a first word line WL(1). The memory cells MC1 may be controlled according to a level of a voltage applied to the word lines WL(1), . . . , WL(n). The NOR flash memory device including the memory cell array 910*a* may perform write and read operations in units of a byte or word, and may perform an erase operation in units of a block 912*a*.

Referring to FIG. 22, a memory cell array 910*b* may include string selection transistors SST, ground selection transistors GST and memory cells MC2. The string selection transistors SST may be coupled to the bit lines BL(1), . . . , BL(m), and the ground selection transistors GST may be coupled to the common source line CSL. The memory cells MC2 arranged in the same column may be disposed in series between one of the bit lines BL(1), . . . , BL(m) and the common source line CSL, and the memory cells MC2 arranged in the same row may be coupled in common to one of the word lines WL(1), WL(2), WL(3), . . . , WL(n−1), WL(n). That is, the memory cells MC2 may be coupled in series between the string selection transistors SST and the ground selection transistors GST, and the 16, 32 or 64 word lines may be disposed between the string selection line SSL and the ground selection line GSL.

The string selection transistors SST are coupled to the string selection line SSL such that the string selection transistors SST may be controlled according to a level of a voltage applied from the string selection line SSL. The memory cells MC2 may be controlled according to a level of a voltage applied to the word lines WL(1), . . . , WL(n).

The NAND flash memory device including the memory cell array 910*b* may perform write and read operations in units of a page 911*b* and an erase operation in units of a block 912*b*. In some example embodiments, each of page buffers may be coupled to even and odd bit lines one by one. In this case, the even bit lines form an even page, the odd bit lines form an odd page, and the write operations for the memory cells MC2 of the even and odd pages may be performed by turns and sequentially.

Referring to FIG. 23, a memory cell array 910*c* may include a plurality of strings 913*c* having a vertical structure. The plurality of strings 913*c* may be formed in a second direction such that a string row may be formed. A plurality of string rows may be formed in a third row such that a string array may be formed. Each of the strings 913*c* may include ground selection transistors GSTV, memory cells MC3 and string selection transistors SSTV which are disposed in series in a first direction between the bit lines BL(1), . . . , BL(m) and the common source line CSL.

The ground selection transistors GSTV may be coupled to the ground selection lines GSL11, GSL12, . . . , GSLi1, GSLi2, respectively, and the string selection transistors SSTV may be connected to the string selection lines SSL11, SSL12, . . . , SSLi1, SSLi2, respectively. The memory cells MC3 arranged on the same layer may be coupled in common to one of the word lines WL(1), WL(2), . . . , WL(n−1), WL(n). The ground selection lines GSL11, . . . , GSLi2 and the string selection lines SSL11, . . . , SSLi2 may extend in the second direction and may be formed along the third direction. The word lines WL(1), . . . , WL(n) may extend in the second direction and may be formed along the first and third directions. The bit lines BL(1), . . . , BL(m) may extend in the third direction and may be formed along the second direction. The memory cells MC3 may be controlled according to a level of a voltage applied to the word lines WL(1), . . . , WL(n).

Since the vertical flash memory device including the memory cell array 910*c* includes NAND flash memory cells, like the NAND flash memory device of FIG. 23, the vertical flash memory device performs the write and read operations in units of a page and the erase operation in units of a block.

In some example embodiments, it may be implemented that two string selection transistors included in one string 913*c* are coupled to one string selection line, and two ground selection transistors included in one string are coupled to one ground selection line. In other example embodiments, it may be implemented that one string includes one string selection transistor and one ground selection transistor.

Referring to FIG. 24, a memory cell array 910*d* includes a plurality of memory cells MC, which are disposed at the positions crossed by the wordlines WL0~WLn and the bitlines BL0~BLm.

Each memory cell MC may include a cell transistor CT and a resistive element CR. The cell transistor CT and the resistive element CR in each memory cell MC are coupled between a source line SL and one of the bitlines BL0~BLm. The memory cells MCs may be coupled to the common source line. In some embodiments, the memory cell array 910*d* may be partitioned into at least two cell regions and the cell regions may be coupled to different source lines.

Figure 25:
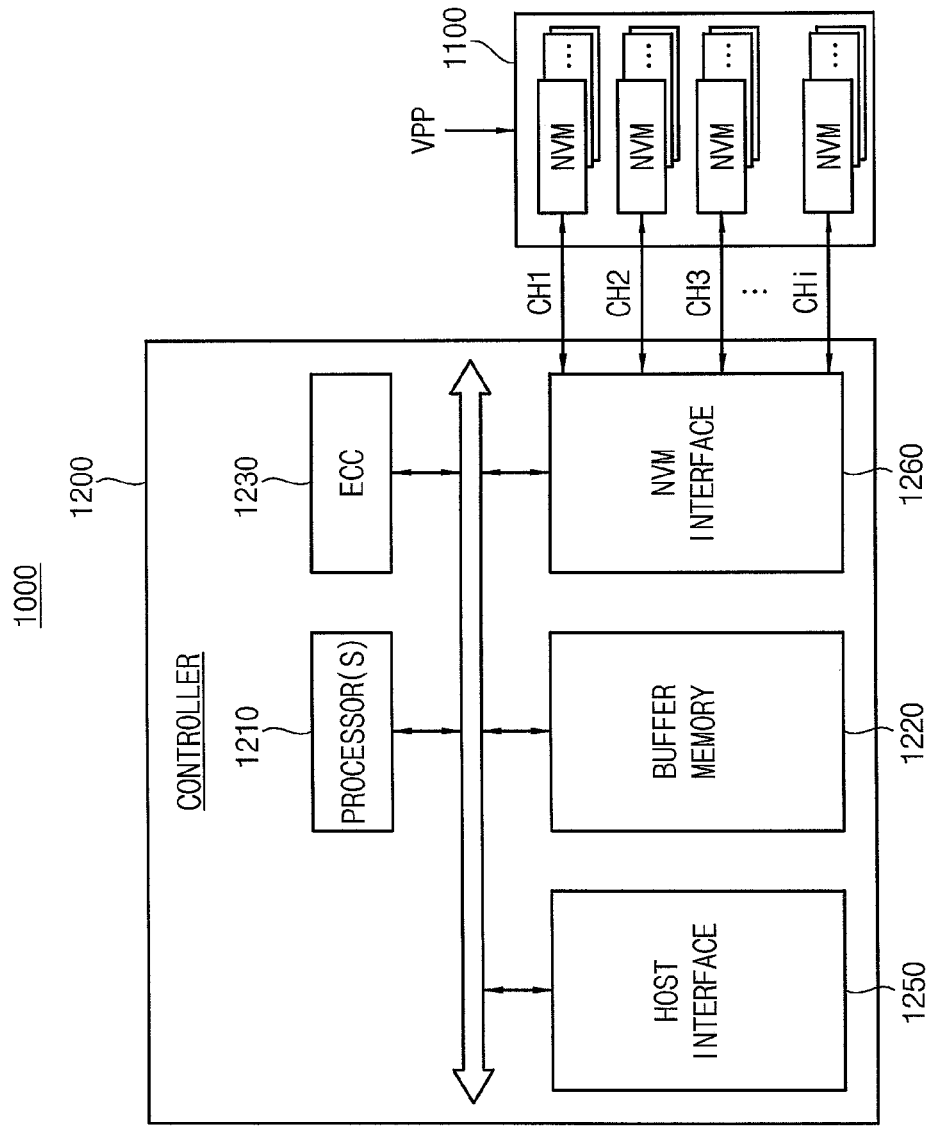
FIG. 25 is a block diagram illustrating a solid state disc or solid state drive (SSD) according to example embodiments.

FIG. 25 is a block diagram illustrating a solid state disc or solid state drive (SSD) according to example embodiments.

Referring to FIG. 25, an SSD 1000 includes multiple nonvolatile memory devices 1100 and an SSD controller 1200.

The nonvolatile memory devices 1100 may be optionally supplied with an external high voltage VPP. Each of the nonvolatile memory devices 1100 may include the above-described vertical NAND flash memory device.

The SSD controller 1200 is connected to the nonvolatile memory devices 1100 through multiple channels CH1 to CHi. The SSD controller 1200 comprises one or more processors 1210, a buffer memory 1220, an ECC block 1230, a host interface 1250, and a nonvolatile memory interface 1260.

The buffer memory 1220 stores data used to drive the SSD controller 1200. The buffer memory 1220 comprises multiple memory lines each storing data or a command. Although FIG. 25 illustrates an embodiment where the buffer memory 1220 is included in the SSD controller 1200, the disclosure is not limited thereto. Alternatively, for instance, the buffer memory 1220 may be placed outside the SSD controller 1200.

The ECC block 1230 calculates error correction code values of data to be programmed at a writing operation and corrects an error of read data using an error correction code value at a read operation. In a data recovery operation, the ECC block 1230 corrects an error of data recovered from the nonvolatile memory devices 1100. Although not shown in FIG. 25, a code memory may be further included to store code data needed to drive the SSD controller 1200. The code memory may be implemented by a nonvolatile memory device.

The host interface 1250 provides an interface with an external device. The nonvolatile memory interface 1260 provides an interface with the nonvolatile memory devices 1100.

The SSD 1000 may include a variable voltage generation circuit (not shown), and the variable voltage generation circuit may be disposed at various positions in the SSD 1000. The variable voltage generation circuit may include a plurality of amplification circuits according to example embodiments. As described above, the variable voltage generation circuit may provide an output voltage having an expanded voltage range with respect to the operational temperature range and enhanced linearity through the multiple feedback operations using the plurality of amplification circuits. Using the output voltage, the SSD 1000 may control the operational characteristics such as the operational timing, voltage level, etc. exactly according to the operational temperature.

Figure 26:
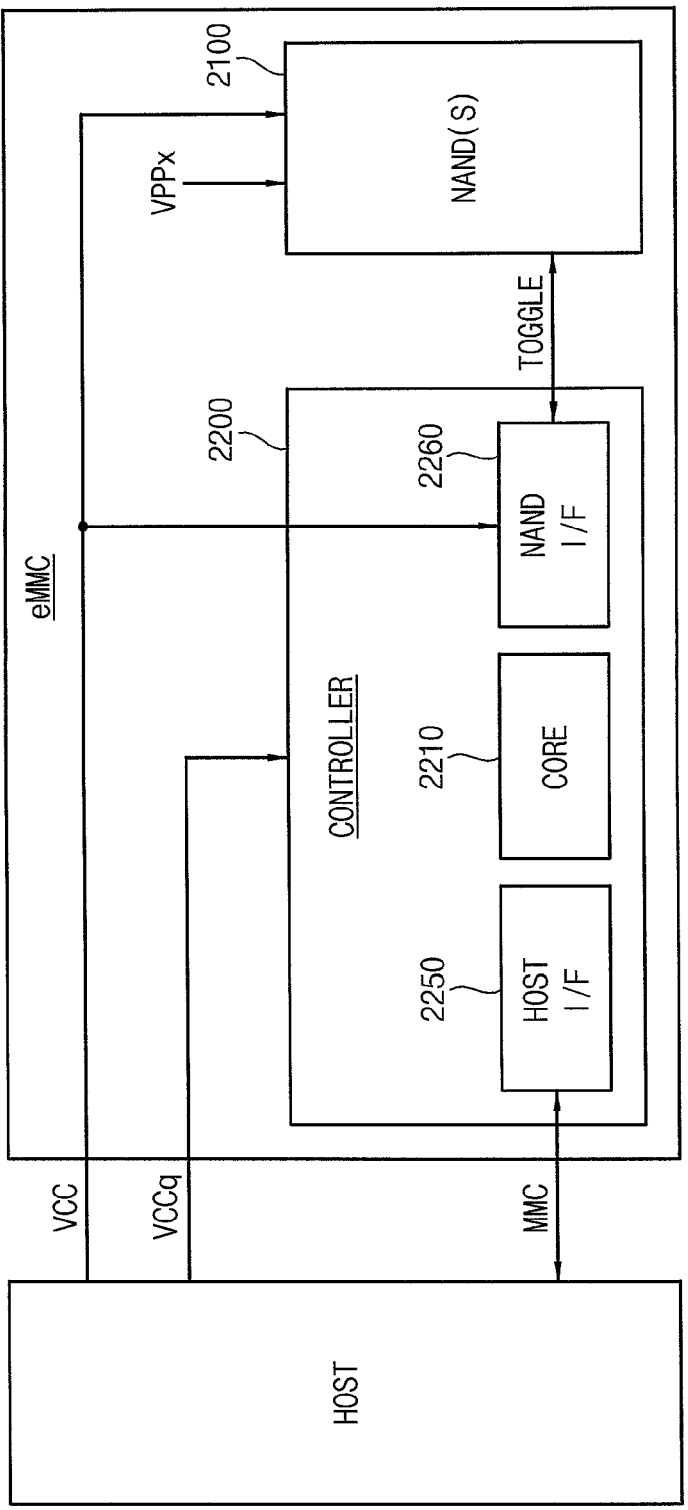
FIG. 26 is a block diagram illustrating an embedded multi-media card (eMMC) according to example embodiments.

FIG. 26 is a block diagram illustrating an embedded multi-media card (eMMC) according to example embodiments.

Referring to FIG. 26, an eMMC 2000 comprises one or more NAND flash memory devices 2100 and a controller 2200.

The controller 2200 is connected with the NAND flash memory device 2100 via multiple channels. The controller 2200 includes one or more controller cores 2210, a host interface 2250, and a NAND interface 2260. The controller core 2210 controls an overall operation of the eMMC 2000. The host interface 2250 is configured to perform an interface between the controller 2210 and a host. The NAND interface 2260 is configured to provide an interface between the NAND flash memory device 2100 and the controller 2200. In some example embodiments, the host interface 2250 may be a parallel interface (e.g., an MMC interface). In other example embodiments, the host interface 2250 of eMMC 2000 may be a serial interface (e.g., UHS-II, UFS, etc.).

The eMMC 2000 receives power supply voltages Vcc and Vccq from the host. For example, the power supply voltage Vcc (e.g., about 3.3V) is supplied to the NAND flash memory device 2100 and the NAND interface 2260, and the power supply voltage Vccq (e.g., about 1.8V/3.3V) is supplied to the controller 2200. In some embodiments, eMMC 2000 may be optionally supplied with an external high voltage VPPx.

The eMMC 2000 may include a variable voltage generation circuit (not shown), and the variable voltage generation circuit may be disposed at various positions in the eMMC 2000. The variable voltage generation circuit may include a plurality of amplification circuits according to example embodiments. As described above, the variable voltage generation circuit may provide an output voltage having an expanded voltage range with respect to the operational temperature range and enhanced linearity through the multiple feedback operations using the plurality of amplification circuits. Using the output voltage, the eMMC 2000 may control the operational characteristics such as the operational timing, voltage level, etc. exactly according to the operational temperature.

Figure 27:
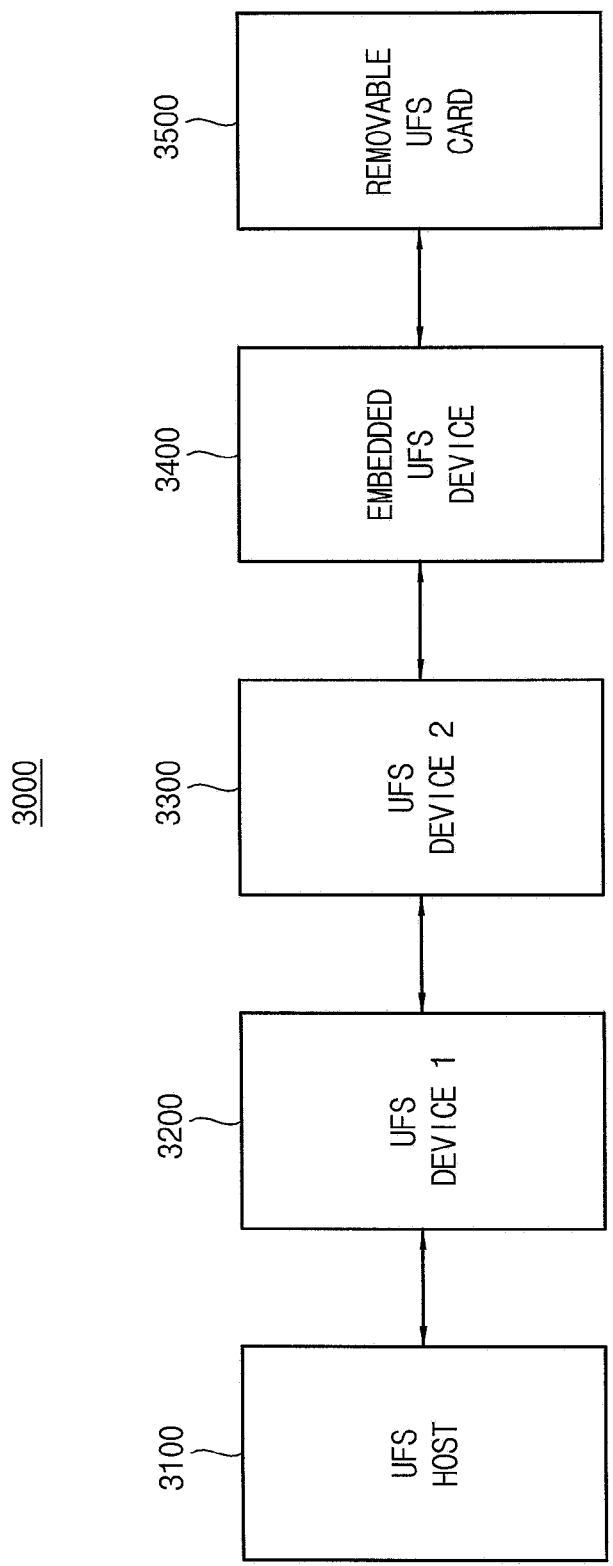
FIG. 27 is a block diagram illustrating a universal flash storage (UFS) according to example embodiments.

FIG. 27 is a block diagram illustrating a universal flash storage (UFS) according to example embodiments.

Referring to FIG. 27, a UFS system 3000 may include a UFS host 3100, UFS devices 3200 and 3300, an embedded UFS device 3400, and a removable UFS card 3500. The UFS host 3100 is an application processor of a mobile device. Each of the UFS host 3100, the UFS devices 3200 and 3300, the embedded UFS device 3400 and the removable UFS card 3500 communicate with external devices through the UFS protocol. At least one of the UFS devices 3200 and 3300, the embedded UFS device 3400, and the removable UFS card 3500 is implemented by a nonvolatile memory device.

At least one of the UFS host 3100, the UFS devices 3200 and 3300, the embedded UFS device 3400, and the removable UFS card 3500 may include a variable voltage generation circuit (not shown). The variable voltage generation circuit may include a plurality of amplification circuits according to example embodiments. As described above, the variable voltage generation circuit may provide an output voltage having an expanded voltage range with respect to the operational temperature range and enhanced linearity through the multiple feedback operations using the plurality of amplification circuits. Using the output voltage, the UFS system 3000 may control the operational characteristics such as the operational timing, voltage level, etc. exactly according to the operational temperature.

Meanwhile, the embedded UFS device 3400 and the removable UFS card 3500 may perform communications using protocols different from the UFS protocol. The UFS host 3100 and the removable UFS card 3500 may communicate through various card protocols (e.g., UFDs, MMC, SD (secure digital), mini SD, Micro SD, etc.).

Figure 28:
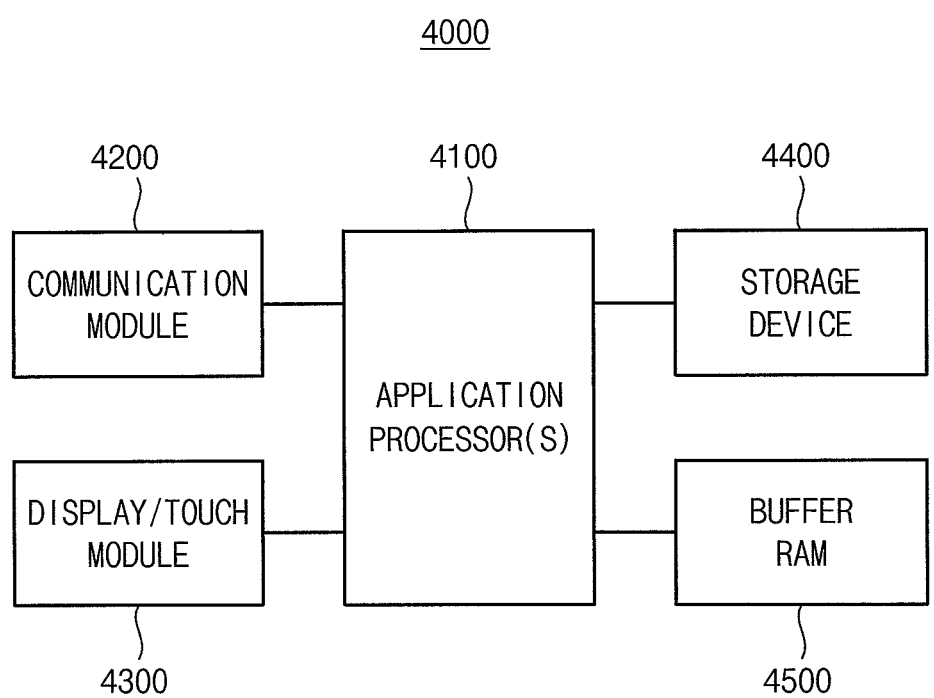
FIG. 28 is a block diagram illustrating a mobile device according to example embodiments.

FIG. 28 is a block diagram illustrating a mobile device according to example embodiments.

Referring to FIG. 28, a mobile device 4000 may include an application processor 4100, a communication module 4200, a display/touch module 4300, a storage device 4400, and a mobile RAM 4500.

The application processor 4100 controls operations of the mobile device 4000. The communication module 4200 is implemented to perform wireless or wire communications with an external device. The display/touch module 4300 is implemented to display data processed by the application processor 4100 or to receive data through a touch panel. The storage device 4400 is implemented to store user data. The storage device 4400 may be an eMMC, a SSD, a UFS device, etc.

The mobile RAM 4500 temporarily stores data used for processing operations of the mobile device 4000.

At least one of the application processor 4100, the communication module 4200, the display/touch module 4300, the storage device 4400, and the mobile RAM 4500 may include a variable voltage generation circuit (not shown). The variable voltage generation circuit may include a plurality of amplification circuits according to example embodiments. As described above, the variable voltage generation circuit may provide an output voltage having an expanded voltage range with respect to the operational temperature range and enhanced linearity through the multiple feedback operations using the plurality of amplification circuits.

Using the output voltage, the mobile device 4000 may control the operational characteristics such as the operational timing, voltage level, etc. exactly according to the operational temperature.

A device or a system according to an embodiment of the disclosure may be packaged using various package types or package configurations, such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

As described above, the variable voltage generation circuit according to example embodiments may expand the output voltage range with respect to the operational temperature range and enhance linearity through the multiple feedback operations using a plurality of amplification circuits having voltage offsets depending on the operational temperature. The device and/or the system including the variable voltage generation circuit may control the operational characteristics of the device and/or the system using the output voltage of the variable voltage generation circuit and thus the performance of the device and/or the system may be enhanced.

The present disclosure may be applied to various devices and systems. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A variable voltage generation circuit comprising:
a first amplification circuit configured to generate a first output voltage based on a reference voltage, a first feedback voltage, a temperature-varied voltage that is varied depending on an operational temperature and a temperature-fixed voltage that is fixed regardless of the operational temperature, the first output voltage being varied in a first voltage range according to a variation of the operational temperature, and configured to generate the first feedback voltage based on the first output voltage; and
a second amplification circuit configured to generate a second output voltage based on the first feedback voltage, a second feedback voltage, the temperature-varied voltage and the temperature-fixed voltage, the second output voltage being varied in a second voltage range wider than the first voltage range according to the variation of the operational temperature, and configured to generate the second feedback voltage based on the second output voltage.

2. The variable voltage generation circuit of claim 1, wherein the first amplification circuit includes a first differential input node pair receiving the reference voltage and the first feedback voltage and the second amplification circuit includes a second differential input node pair receiving the first feedback voltage and the second feedback voltage.

3. The variable voltage generation circuit of claim 2, wherein each of the first amplification circuit and the second amplification circuit further includes a differential input node pair receiving the temperature-varied voltage and the temperature-fixed voltage.

4. The variable voltage generation circuit of claim 2, wherein the first amplification circuit generates a first voltage offset corresponding to a difference between the reference voltage and the first feedback voltage based on the temperature-varied voltage and the second amplification circuit generates a second voltage offset corresponding to a difference between the first feedback voltage and the second feedback voltage based on the temperature-varied voltage.

5. The variable voltage generation circuit of claim 4, wherein the first voltage range is proportional to the first voltage offset and the second voltage range is proportional to a sum of the first voltage offset and the second voltage offset.

6. The variable voltage generation circuit of claim 1, wherein the first amplification circuit and the second amplification circuit have the same configuration and the second voltage range is twice the first voltage range.

7. The variable voltage generation circuit of claim 1, wherein the first amplification circuit includes:
a first differential difference amplifier configured to generate a first amplification voltage based on the reference voltage, the first feedback voltage, the temperature-varied voltage and the temperature-fixed voltage; and
a first output circuit configured to generate the first output voltage and the first feedback voltage proportional to the first output voltage based on the first amplification voltage.

8. The variable voltage generation circuit of claim 7, wherein the second amplification circuit includes:
a second differential difference amplifier configured to generate a second amplification voltage based on the first feedback voltage, the second feedback voltage, the temperature-varied voltage and the temperature-fixed voltage; and
a second output circuit configured to generate the second output voltage and the second feedback voltage proportional to the second output voltage based on the second amplification voltage.

9. The variable voltage generation circuit of claim 1, further comprising:
a third amplification circuit configured to generate a third output voltage based on the second feedback voltage, a third feedback voltage, the temperature-varied voltage and the temperature-fixed voltage, the third output voltage being varied in a third voltage range wider than the second voltage range according to the variation of the operational temperature, and configured to generate the third feedback voltage based on the third output voltage.

10. The variable voltage generation circuit of claim 9, wherein the first amplification circuit includes a first differential input node pair receiving the reference voltage and the first feedback voltage, the second amplification circuit includes a second differential input node pair receiving the first feedback voltage and the second feedback voltage and the third amplification circuit includes a third differential input node pair receiving the second feedback voltage and the third feedback voltage.

11. The variable voltage generation circuit of claim 9, wherein the first amplification circuit, the second amplification circuit and the third amplification circuit have the same configuration, the second voltage range is twice the first voltage range, the third voltage range is three times the first voltage range.

12. A variable voltage generation circuit comprising:
a first amplification circuit configured to generate a first output voltage based on a reference voltage, a first feedback voltage, a temperature-varied voltage that is varied depending on an operational temperature and a temperature-fixed voltage that is fixed regardless of the operational temperature, the first output voltage being varied in a first voltage range according to a variation of the operational temperature, and configured to generate the first feedback voltage based on the first output voltage; and
second through n-th amplification circuits, a k-th amplification circuit (k is an integer greater than 1 and smaller than or equal to n) configured to generate a k-th output voltage based on a (k−1)-th feedback voltage, a k-th feedback voltage, the temperature-varied voltage and the temperature-fixed voltage, the k-th output voltage being varied in a k-th voltage range wider than a (k−1)-th voltage range according to the variation of the operational temperature, and configured to generate the k-th feedback voltage based on the k-th output voltage.

13. The variable voltage generation circuit of claim 12, wherein the first amplification circuit includes a first differential input node pair receiving the reference voltage and the first feedback voltage and the k-th amplification circuit includes a k-th differential input node pair receiving the (k−1)-th feedback voltage and the k-th feedback voltage.

14. The variable voltage generation circuit of claim 12, wherein the first through k-th amplification circuits have the same configuration and the k-th voltage range is k times the first voltage range.

15. The variable voltage generation circuit of claim 12, further comprising:
a selector configured to select and output one of first through n-th output voltages generated respectively by the first through n-th amplification circuits.

16. A variable amplifier comprising:
a first linear amplifier that generates a first voltage within a first voltage range according to a linear relationship of a reference voltage, a difference between a voltage that varies in accordance with an environmental temperature and a voltage that is invariant with respect to the environmental temperature, and a first amplification factor; and
a second linear amplifier that generates a second voltage within a second voltage range according to a linear relationship of the first voltage, the difference between the voltage that varies in accordance with the environmental temperature and the voltage that is invariant with respect to the environmental temperature, and a second amplification factor, wherein:
the first linear amplifier generates the first voltage, $V_1$, expressed as:

$$V_1 = V_{Ref} + C_1 * (V_{tv} - V_{ti}),$$

where $V_{Ref}$ is the reference voltage, $C_1$ is the first amplification factor, $V_{tv}$ is the voltage that varies in accordance with the environmental temperature, and $V_{ti}$ is the voltage that is invariant with respect to the environmental temperature; and
the second linear amplifier generates the second voltage, $V_2$, expressed as:

$$V_2 = V_1 + C_2 * (V_{tv} - V_{ti}),$$

where $C_2$ is the second amplification factor.

17. The variable amplifier of claim 16, wherein the second voltage range includes the entire first voltage range.

18. The variable amplifier of claim 16, wherein:
the first voltage varies linearly within the first voltage range in accordance with a change in the difference between the voltage that varies in accordance with the environmental temperature and the voltage that is invariant with respect to the environmental temperature, and
the second voltage varies linearly within the second voltage range in accordance with the change in the difference between the voltage that varies in accordance with the environmental temperature and the voltage that is invariant with respect to the environmental temperature.

19. The variable amplifier of claim 16, further comprising a third amplifier that generates a third voltage, $V_3$, within a third voltage range according to a linear relationship $$V_3 = V_1 + n * C_1 * (V_{tv} - V_{ti}),$$

where n is an integer greater than 1.

* * * * *